(12) United States Patent
Osame et al.

(10) Patent No.: US 7,327,169 B2
(45) Date of Patent: Feb. 5, 2008

(54) CLOCKED INVERTER, NAND, NOR AND SHIFT REGISTER

(75) Inventors: Mitsuaki Osame, Atsugi (JP); Aya Anzai, Tsukui (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 71 days.

(21) Appl. No.: 10/668,247

(22) Filed: Sep. 24, 2003

(65) Prior Publication Data

US 2004/0061542 A1    Apr. 1, 2004

(30) Foreign Application Priority Data

Sep. 25, 2002  (JP)  ............... 2002-278724
Oct. 30, 2002  (JP)  ............... 2002-316363

(51) Int. Cl.
  *H03K 19/20*  (2006.01)
(52) U.S. Cl. ............... 326/104; 345/100; 345/92;
  345/99; 326/113; 326/93; 326/108; 327/218;
  327/291; 327/202; 327/203
(58) Field of Classification Search ............... 326/104,
  326/108, 113, 93, 95, 98; 327/202, 203,
  327/219, 291, 155–157; 345/99, 100, 92,
  345/46, 211
See application file for complete search history.

(56) References Cited

U.S. PATENT DOCUMENTS 5,136,622 A    8/1992  Plus 5,523,966 A    6/1996  Idei et al.
5,883,798 A    3/1999  Yamaguchi
5,936,459 A    8/1999  Hamamoto
5,973,533 A   10/1999  Nagaoka (Continued)

FOREIGN PATENT DOCUMENTS

CN        1231081       10/1999

(Continued)

OTHER PUBLICATIONS

European Search Report dated Sep. 29, 2004 for EP 03 02 1743.

*Primary Examiner*—Vibol Tan
(74) *Attorney, Agent, or Firm*—Eric J. Robinson; Robinson Intellectual Property Law Office, P.C.

(57) ABSTRACT

A threshold voltage of a transistor is fluctuated because of fluctuation in film thickness of a gate insulating film or in gate length and gate width caused by differences of used substrates or manufacturing steps. In order to solve the problem, according to the present invention, there is provided a clocked inverter including a first transistor and a second transistor connected in series, and a compensation circuit including a third transistor and a fourth transistor connected in series. In the clocked inverter, gates of the third transistor and the fourth transistor are connected to each other, drains of the third transistor and the fourth transistor are each connected to a gate of the first transistor, sources of the first transistor and the fourth transistor are each electrically connected to a first power source, a source of the second transistor is electrically connected to a second power source, and an amplitude of a signal inputted to a source of the third transistor is smaller than a potential difference between the first power source and the second power source.

34 Claims, 12 Drawing Sheets

U.S. PATENT DOCUMENTS

| | | | |
|---|---|---|---|
| 6,057,823 A * | 5/2000 | Aoki et al. | 345/99 |
| 6,072,345 A * | 6/2000 | Ooishi | 327/157 |
| 6,114,907 A | 9/2000 | Sakurai | |
| 6,181,183 B1 | 1/2001 | Von Basse et al. | |
| 6,232,795 B1 | 5/2001 | Takahashi et al. | |
| 6,252,426 B1 | 6/2001 | Fulkerson | |
| 6,275,210 B1 | 8/2001 | Maekawa | |
| 6,323,691 B1 | 11/2001 | Takahashi | |
| 6,563,744 B2 | 5/2003 | Kuroki | |
| 6,593,920 B2 | 7/2003 | Okumura et al. | |
| 6,603,453 B2 * | 8/2003 | Yamazaki et al. | 345/92 |
| 6,759,701 B2 | 7/2004 | Shimizume | |
| 2001/0017609 A1 | 8/2001 | Okumura et al. | |
| 2001/0040469 A1 | 11/2001 | Takahashi et al. | |
| 2002/0024362 A1 | 2/2002 | Takahashi et al. | |
| 2002/0047733 A1 | 4/2002 | Shimizume | |
| 2002/0130683 A1 | 9/2002 | Nishio et al. | |
| 2003/0012330 A1 | 1/2003 | Osame | |
| 2003/0210219 A1 * | 11/2003 | Osame | 345/92 |
| 2004/0004593 A1 | 1/2004 | Okumura et al. | |
| 2004/0257117 A1 | 12/2004 | Kimura | |

FOREIGN PATENT DOCUMENTS

| | | |
|---|---|---|
| JP | 11-184440 | 7/1999 |
| JP | 2000-339985 | 12/2000 |

* cited by examiner

PRIOR ART

CLOCKED INVERTER, NAND, NOR AND SHIFT REGISTER

BACKGROUND OF THE INVENTION

1. Field of the Invention

The present invention relates to a clocked inverter and also relates to a shift register including a clocked inverter as a unit circuit. Further, the present invention relates to electric circuits such as a NAND and a NOR.

2. Description of the Related Arts

In recent years, display devices such as a liquid crystal display device and a light emitting device have been developing greatly because of the growth in demand of mobile machines. A technique for integrating a pixel and a driver circuit (hereinafter, internal circuit) using a transistor formed of a polysilicon semiconductor on an insulator has been developing greatly, because the technique can contribute to miniaturization of devices and less electric power consumption. The internal circuit formed on an insulator is connected with a controller IC or the like (hereinafter, external circuit) thorough a FPC or the like to be controlled.

Generally, the power source voltage of an internal circuit is approximately 10 V whereas an IC that constitutes an external circuit prepares a signal with approximately 3 V amplitude, since the IC can operate with lower power source voltage than an internal circuit. In order to accurately operate an internal circuit with the signal with approximately 3 V amplitude, there is a shift register in which a level shift portion is arranged in each stage. (Reference 1. Japanese Patent Laid-Open No. 2000-339985)

FIGS. 11A, 11B, 11C and 11D show a circuit diagram of a clocked inverter, a logic symbol of the clocked inverter, a circuit diagram of a NAND and a circuit diagram of a NOR, respectively.

When level shifting is performed in an internal circuit, problems are caused, for example, in increase in occupation area of a driver circuit, reduction of frequency property due to delayed or blunted waveforms. Furthermore, as described in the Reference 1, it is necessary to suppress fluctuation in TFT characteristics between adjacent TFTs when the current driving type of shift register is used. On the contrary, when a level shifter is arranged in an external circuit, problems are caused, for example, growth in total size of a casing for devices due to the increase in the number of components such as IC, in cost for manufacturing and in power consumption by the shift register. Accordingly, it is preferable to use a signal with approximately 3 V amplitude without level shifting.

Further, a threshold voltage of a TFT is fluctuated because of fluctuation in film thickness of a gate insulating film or in gate length and gate width caused by differences of used substrates or manufacturing steps, and thus the threshold voltage value may be different from an expected value. In such case, when a signal with a small amplitude, approximately 3 V amplitude is used in a digital circuit in which two logical level, 1 and 0 are used, the TFT may not be operated accurately due to the influence of the fluctuation in the threshold voltage.

SUMMARY OF THE INVENTION

The present invention has been made in view of the above problems. It is an object of the present invention to realize miniaturization of a casing for devices and to reduce manufacturing costs and power consumption by providing the shift register without arranging any level shifter in an external circuit. Further, according the present invention, the shift register can be achieved without arranging any level shifter in an internal circuit to solve such problems that the waveform of CK is delayed and blunted and that the voltage of a power source line arranged in the internal circuit is dropped. Also, the reduction of an area occupied by a driver circuit in the internal circuit, the reduction of power consumption, and a high frequency operation can be realized.

Further, it is another object of the present invention to provide a clocked inverter, a shift register that can be operated accurately by mitigation of the influence of the fluctuation in the property of TFT. Moreover, it is possible to provide a NAND circuit or a NOR circuit that has lower input load and higher output ability as compared to conventional NAND circuit or NOR circuit.

In order to achieve the above-mentioned objects, according to the present invention, there are employed the following measures.

According to the present invention, there is provided a clocked inverter including:

a first transistor and a second transistor connected in series, and a compensation circuit including a third transistor and a fourth transistor connected in series, in which:

gates of the third transistor and the fourth transistor are connected to each other;

drains of the third transistor and the fourth transistor are each connected to a gate of the first transistor;

sources of the first transistor and the fourth transistor are each electrically connected to a first power source;

a source of the second transistor is electrically connected to a second power source; and an amplitude of a signal inputted to a source of the third transistor is smaller than a potential difference between the first power source and the second power source.

According to the clocked inverter of the present invention, the first power source is a high potential power source, the second power source is a low potential power source, the first transistor and the fourth transistor are each a P-type transistor, and the second transistor and the third transistor are each an N-type transistor.

According to the clocked inverter of the present invention, the first power source is a low potential power source, the second power source is a high potential power source, the first transistor and the fourth transistor are each an N-type transistor, and the second transistor and the third transistor are each a P-type transistor.

According to the present invention, there is provided a NAND including:

a first transistor and a second transistor connected in parallel;

a third transistor connected to the first transistor and the second transistor in series; and a compensation circuit including a fourth transistor and a fifth transistor connected in series, in which:

gates of the fourth transistor and the fifth transistor are connected to each other;

drains of the fourth transistor and the fifth transistor are each connected to a gate of the third transistor;

sources of the first transistor and the second transistor are each electrically connected to a high potential power source;

sources of the third transistor and the fifth transistor are each electrically connected to a low potential power source; and an amplitude of a signal inputted to a source of the fourth transistor and each of gates of the first transistor, the second transistor, the fourth transistor, and the fifth transistor is smaller than a potential difference between the high potential power source and the low potential power source.

According to the present invention, there is provided a NOR including:

a first transistor and a second transistor connected in parallel;

a third transistor connected to the first transistor and the second transistor in series; and a compensation circuit including a fourth transistor and a fifth transistor connected in series, in which:

gates of the fourth transistor and the fifth transistor are connected to each other;

drains of the fourth transistor and the fifth transistor are each connected to a gate of the third transistor;

sources of the first transistor and the second transistor are each electrically connected to a low potential power source;

sources of the third transistor and the fifth transistor are each electrically connected to a high potential power source; and an amplitude of a signal inputted to each of gates of the first transistor, the second transistor, the fourth transistor, and the fifth transistor, and to a source of the fourth transistor is smaller than a potential difference between the high potential power source and the low potential power source.

According to the present invention, there is provided a shift register including:

a clocked inverter including a first transistor to a third transistor connected in series; and a compensation circuit including a fourth transistor and a fifth transistor connected in series, in which:

sources of the first transistor and the fifth transistor are each electrically connected to a first power source;

a source of the third transistor is electrically connected to a second power source;

a gate of the first transistor is connected to an output terminal of the compensation circuit;

a pulse generated at an (n−1)th stage is inputted to an input terminal of the compensation circuit arranged at an n-th stage; and a pulse or a clock signal generated at an (n−2)th stage is inputted to a source of the fourth transistor arranged at the n-th stage.

The present invention having the structures described above provides a clocked inverter and a shift register that are capable of relaxing an influence of fluctuation in the threshold value of a TFT, achieving an operation without level-shifting a signal having a voltage amplitude that is smaller than the power source voltage amplitude of a circuit, and performing a high frequency operation and a low voltage operation. A NAND and a NOR having a low input load and a high output capability are also provided.

Also, no level shifter is arranged in an external circuit, so that the miniaturization of a casing, the reduction of manufacturing costs, and the reduction of power consumption are realized. Further, the shift register is achieved without arranging any level shifter in an internal circuit. As a result, such problems that the waveform of CK is delayed and blunted and that the voltage of a power source line arranged in the internal circuit is dropped are solved. Also, the reduction of an area occupied by a driver circuit in the internal circuit, the reduction of power consumption, and a high frequency operation are realized.

It should be noted here that the clocked inverter is not limited to the type shown in FIGS. 11A to 11D and includes a type, in which the clocked inverter shown in FIG. 11A is modified and a clock signal is not directly inputted, such as a clocked inverter 10 in FIG. 1A, a clocked inverter 10 in FIG. 1C, a clocked inverter 10 in FIG. 2A, a clocked inverter 10 in FIG. 2C, clocked inverters 10 and 17 in FIG. 3A, clocked inverters 10 and 17 in FIG. 3C, and clocked inverters 10 and 17 in FIG. 12A.

DESCRIPTION OF THE PREFERRED EMBODIMENTS

Embodiment Mode 1

This embodiment mode of the present invention will be described below with reference to FIGS. 1A to 1D. In this embodiment mode, as an example, it is assumed that CK is switched between 5 V (H level) and 2 V (L level), VDD (high potential power source) is 7 V, and VSS (low potential power source) is 0 V. That is, it is assumed that the amplitude of CK is 3 V and a power source voltage amplitude is 7 V.

Figure 1A:
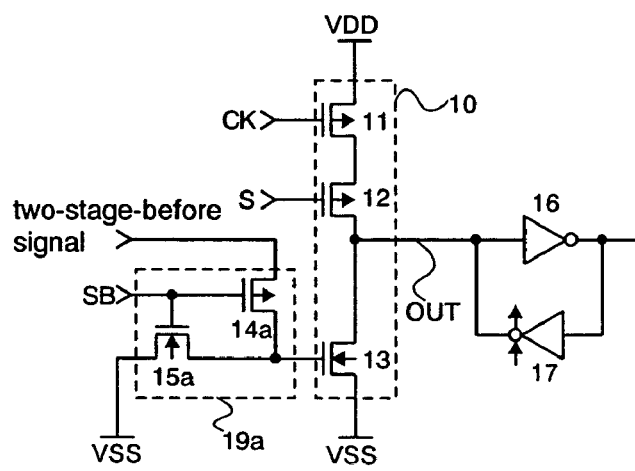
FIGS. 1A to 1D are circuit diagrams of one stage of a shift register and timing charts.

A first structure of the present invention will be described with reference to FIG. 1A. FIG. 1A is a circuit diagram showing structural elements of a shift register arranged in the n-th stage. Each stage is formed by a clocked inverter 10 including TFTs 11 to 13 connected in series, a compensation circuit 19a including TFTs 14a and 15a connected in series, an inverter 16, and a clocked inverter 17. The shift register is formed by cascade-connecting the respective stages, in which these circuits are arranged, with signals from CK and CKB being alternately inputted at the respective stages.

The gate of the TFT 11 is connected to a clock signal line and receives CK. The gate of the TFT 12 receives a signal S that is a start pulse or the output of the inverter 16 arranged at the (n−1)th stage, the gates of the TFTs 14a and 15a receive a signal SB that is the inverted signal of the signal S, and the source of the TFT 14a receives the output of the clocked inverter 10 arranged at the (n−2)th stage. Note that in the drawings, the output of the clocked inverter 10 arranged at the (n−2)th stage is denoted as the "two-stage-before signal".

In the present invention, in the compensation circuit 19, the gates of the TFTs 14a and 15a connected to each other are each set as an input terminal, and the drains of the TFTs 14a and 15a connected to each other are each set as an output terminal.

Figure 1B:
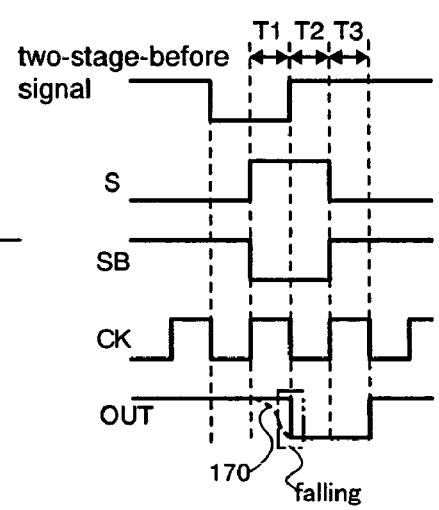

Operations will be described by following a timing chart shown in FIG. 1B. In FIG. 1B, one half of the cycle of the clock signal is set as "T". Operations in periods T1 and T2 will be described below.

In the period T1, the two-stage-before signal is at VSS, the signal S is at VDD, the signal SB is at VSS, and CK is at the H level (5 V), so that the TFT 12 is turned off, the TFT 14a is turned off, the TFT 15a is turned off, and the TFT 13 is turned off. In this case, VDD is held by a loop formed by the inverter 16 and the clocked inverter 17 and an output OUT assumes VDD.

Following this, when time advances from the period T1 to the period T2, the two-stage-before signal is switched from VSS to VDD, the signal S remains at VDD, the signal SB remains at VSS, and CK is switched to the L level (2 V), so that the TFT 12 remains turned off, the TFT 14a is turned on, and the TFT 15a remains turned off. In this case, the signal inputted to the gate of the TFT 13 is switched to VDD, so that the TFT 13 is switched from an OFF state to an ON state. As a result, the output OUT assumes VSS. In the present invention, the switching of OUT from VDD to VSS is referred to as the "falling".

Figure 1C:
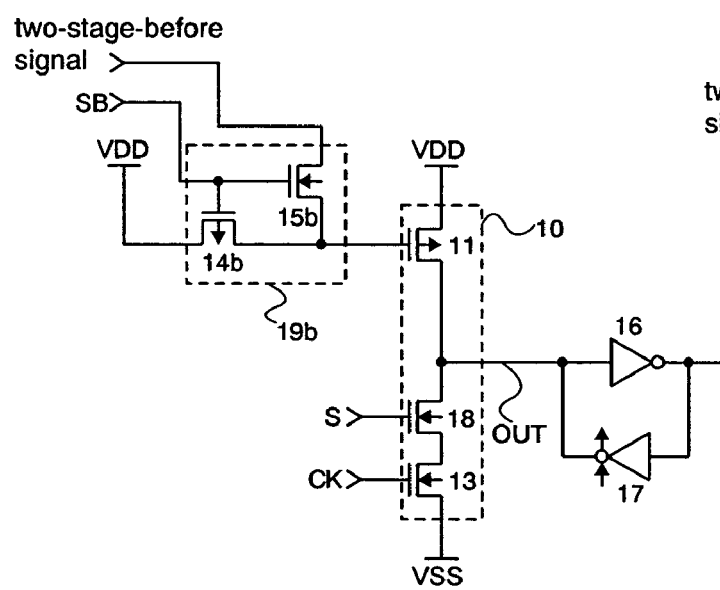

Next, a second structure of the present invention will be described with reference to FIG. 1C. FIG. 1C is a circuit diagram showing structural elements of a shift register arranged at the nth stage. The differences from the first structure described above are that a compensation circuit 19b including TFTs 14b and 15b connected in series is connected to the gate of the TFT 11, the P-type TFT 12 is eliminated and an N-type TFT 18 is arranged instead, the source of the TFT 15b receives the output of the clocked inverter 10 arranged at the (n−2)th stage, the gate of the TFT 18 receives the signal S, and the clock signal line is connected to the gate of the TFT 13 and CK is inputted to the gate of the TFT 13.

Next, operations in periods T1 and T2 will be described with reference to a timing chart shown in FIG. 1D. Note that the operation according to the second structure is similar to the operation according to the first structure described above and therefore will be described in brief.

In the period T1, the output OUT assumes VSS. When time advances from the period T1 to the period T2, the two-stage-before signal inputted to the gate of the TFT 11 is switched from VDD to VSS, so that the TFT 11 is turned on. On the other hand, the TFT 18 is turned off, so that the output OUT assumes VDD. In the present invention, the switching of OUT from VSS to VDD is referred to as the "rising".

The present invention having the first structure described above is very effective for the falling, and the present invention having the second structure described above is very effective for the rising. As a result, the following effect (1) is provided.

The effect (1) will first be described. When CK is inputted as it is to the source of the TFT 14a shown in FIG. 1A or the source of the TFT 15b shown in FIG. 1C, there arises a problem that the TFT described above is turned on earlier than a desired timing because the amplitude of CK is small. In more detail, there arises a problem that a signal having a dotted waveform 170 in FIG. 1B or a signal having a dotted waveform 171 in FIG. 1D is generated. That is, there arises a problem that when a leak current is large, shift of pulse does not occur. In the present invention, however, the two-stage-before signal is used, so that it is possible to turn on the TFT described above at desired timing without being turned on too early. As a result, it is possible to solve such the problem that the shift of the pulse does not occur.

In addition to the effect (1) described above, the present invention having the first structure or the second structure described above provides the following advantageous effects (2) and (3).

First, the effect (2) will be described. In usual cases, a clocked inverter is formed by four TFTs that are two N-type TFTs connected in series and two P-type TFTs connected in series. Also, in order to obtain a large on-current, the gate widths (W) of the two TFTs connected in series are set large, which results in the necessity to increase the gate width of a TFT whose gate functions as a load. As a result, the overall load is increased and a high frequency operation is obstructed. In the present invention, however, it is possible to change a double-gate TFT (two TFTs connected in series) into a single-gate TFT. In the case of the structure shown in FIG. 1A, for instance, it has conventionally been required to arrange two N-type TFTs connected in series. It is, however, sufficient that only one N-type TFT 13 is arranged in the present invention. As a result, in the present invention, it is not required to increase the gate widths of the TFTs and it is possible to reduce the sizes of the TFTs, which makes it possible to realize a high integration. Further, the burden on an element, whose gate (gate capacitance) functions as a load, is reduced and the overall load is also reduced, so that a high frequency operation becomes possible.

Next, the effect (3) will be described. Two TFTs of the same conductive type connected in series are weak in current performance (power). In the present invention, however, it is possible to change a double-gate TFT into a single-gate TFT, which makes it possible to enhance the current performance of the TFT. In the structure shown in FIG. 1A, for instance, it is possible to enhance the current performance of the N-type TFT 13. Also, in the structure shown in FIG. 1C, it is possible to enhance the current performance of the P-type TFT 11. Note that the current performance is defined as $K=\mu C_{OX}W/2L$, where K is current performance, $\mu$ is mobility of carrier, $C_{OX}$ is capacitance of gate insulating film per unit area, W is channel width, and L is channel length.

As described above, the structure shown in FIG. 1A is very effective for the falling and rising. In FIGS. 1A and 1B, however, when time advances to the period T3, S is switched to VSS, SB is switched to VDD, and CK is switched to the H level, so that the TFT 12 is turned on, the TFT 13 is turned off, and the TFT 11 is turned on or off depending on its threshold value. If the threshold value of the TFT 11 is lower than a desired value, there arises a case in which the TFT 11 is turned on and therefore the shift register does not operate properly.

In view of this problem, a structure that is effective for the holding VSS without making OUT rising earlier in the period T3 will be proposed as a third structure of the present invention.

Figure 2A:
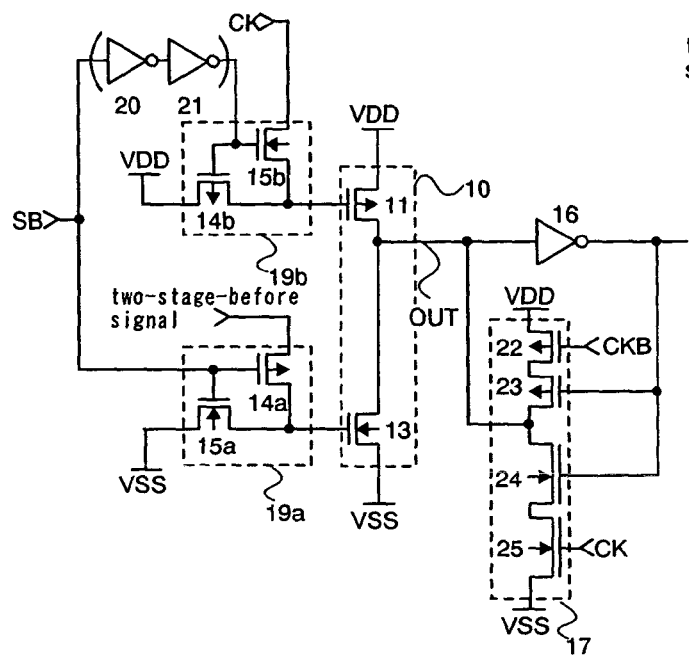
FIGS. 2A to 2D are circuit diagrams of one stage of a shift register and timing charts.

The third structure of the present invention will be described with reference to FIG. 2A. FIG. 2A is a circuit diagram showing structural elements of a shift register arranged in the n-th stage. Each stage is formed by a clocked inverter 10 including TFTs 11 and 13 connected in series, a compensation circuit 19a including TFTs 14a and 15a connected in series, a compensation circuit 19b including TFTs 14b and 15b, an inverter 16, and a clocked inverter 17 including TFTs 22 to 25. The shift register is formed by cascade-connecting the respective stages, in which these circuits are arranged, with CK and CKB being alternately inputted at the respective stages. The differences between the structure shown in FIG. 2A and the structure shown in FIG. 1A reside in that the TFT 12 is eliminated, the output of the compensation circuit 19b is connected to the gate of the TFT 11, SB is connected to the input of the compensation circuit 19b, VDD is connected to the source of the TFT 14b, CK is connected to the source of the TFT 15b, and the channel width is so set large that the current performance of the TFT 24 and the TFT 25 are enhanced.

Operations of a structure shown in FIG. 2A in periods T1 and T2 will be described with reference to a timing chart shown in FIG. 2B.

In the period T1, the two-stage-before signal is at VDD, the signal SB is at VSS, and the clock signal CK is at the L level, so that the TFT 14a is turned on, the TFT 15a is turned off, the TFT 13 is turned on, the TFT 14b is turned on, the TFT 15b is turned off, and the TFT 11 is turned off. As a result, the output OUT assumes VSS.

Next, in the period T2, the two-stage-before signal remains at VDD, the signal SB is switched to VDD, and the clock signal CK is switched to the H level, so that the TFT 13 is turned off and the TFT 11 is turned on or off. Under this state, OUT at VSS is held by a Loop formed by the inverter 16 and the clocked inverter 17, and VSS is continuously outputted as OUT. Note that in the present invention, the operation performed in the period T2 is referred to as the "holding". This structure is very effective for the holding. The holding operation in the period T2 will be described in more detail below.

In the period T2, the signal SB is at VDD (7 V). VGS of the TFT 15b becomes 2 V when the signal SB is at VDD (7 V) and CK is at the H level (5 V).

Under this condition, if the threshold voltage (|VTH|) of the TFT 15b is equal to or less than 2 V, the TFT 15b is turned on and CK (H level, 5 V) is inputted to the gate of the TFT 11. Then, the TFT 11 is turned on or off depending on its threshold voltage.

If the TFT 11 is turned on, it attempts to output VDD as OUT. However, the current capacities of the TFT 24 and the TFT 25 of the clocked inverter 17 holding VSS are set large, so that VSS is outputted and a theoretically proper operation is performed. As a result, as indicated by a dotted waveform 172 in the timing chart shown in FIG. 2B, such a situation is prevented, in which a signal outputted as OUT is not correctly held and switching from VSS to VDD is performed earlier than desired timing.

Also, even if a correct operation is performed as described above, when the P-type TFT 11 that should be turned off remains turned on, there arises a problem that a leak current flows between VDD and VSS and therefore the current consumption is increased. In such a case, as shown in FIG. 2A, inverters 20 and 21 may be connected to the gates of the TFT 14b and the TFT 15b. With this structure, as indicated by a dotted waveform 174 in FIG. 2B, it is possible to delay the signal SB and to delay the timing at which the TFT 15b is turned on, which makes it possible to delay timing at which a leak current flows. Note that the number of inverters to be connected is not specifically limited so long as no theoretical difference occurs, although the degree of the delay is set at equal to or less than one half of the cycle of CK.

On the other hand, if the threshold voltage (|VTH|) of the TFT 11 or the TFT 15b is equal to or more than 2 V, the TFT 15b is not turned on and no leak current is generated. If it is possible to prevent the generation of the leak current, an increase in current consumption and the rising of the waveform of the output signal OUT earlier than the desired timing are prevented. As a result, a signal having a stabilized waveform is generated.

Figure 1D:
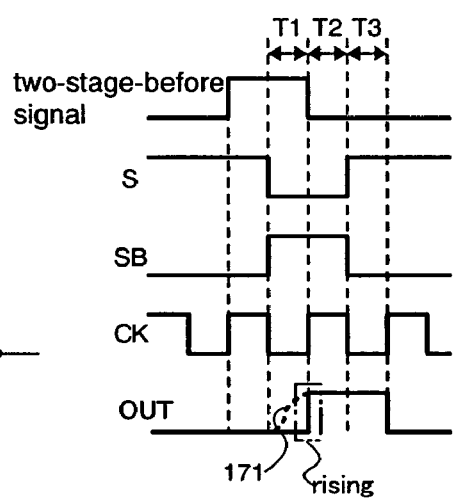

Also, in the period T3 in FIGS. 1C and 1D, there arises a case in which the threshold value of the N-type TFT 15b is lower than a desired value and the N-type TFT 15b is turned on. In this case, it is impossible to hold OUT at VDD and the shift register does not operate properly.

In view of this, a structure that is effective for the holding of OUT at VDD in the period T3 will be proposed as a fourth structure of the present invention.

A fourth structure of the present invention will be described with reference to FIG. 2C. FIG. 2C is a circuit diagram showing structural elements of a shift register arranged in the n-th stage. The differences of the structure shown in FIG. 2C from the second structure reside in that the TFT 18 is eliminated, the output of the compensation circuit 19a is connected to the gate of the TFT 13, SB is connected to the input of the compensation circuit 19a, CK is connected to the source of the TFT 14a, VSS is connected to the source of the TFT 15a, and the channel width is set large so that the current performance of the TFT 22 and the TFT 23 are enhanced.

Next, operations in periods T1 and T2 will be described by following a timing chart shown in FIG. 2D. Note that the operation according to the structure shown in FIG. 2C is similar to the operation according to the structure shown in FIG. 2A described above and therefore will be described in brief.

In the period T1, the two-stage-before signal is at VSS, the signal SB is at VDD, and the clock signal CK is at the H level, so that the TFT 14b is turned off, the TFT 15b is turned on, and the TFT 11 is turned on. As a result, the output OUT assumes VDD.

Next, in the period T2, the two-stage-before signal remains at VSS, the signal SB is switched to VSS, and the clock signal CK is switched to the L level, so that the TFT 11 is turned off and the TFT 13 is turned on or off. Under this state, OUT at VDD is held by a loop formed by the inverter 16 and the clocked inverter 17, and VDD is continuously outputted as OUT. This structure is very effective for the holding. The operation in the period T2 will be described in more detail below.

In the period T2, the signal SB is at VSS (0 V). VGS of the TFT 14a becomes 2 V when the signal SB is at VSS (0 V) and CK is at the L level (2 V).

Under this condition, if the threshold voltage (|VTH|) of the TFT 14a is equal to or less than 2 V, the TFT 14a is turned on and CK (L level, 2 V) is inputted to the gate of the TFT 13. Then, the TFT 13 is turned on or off depending on its threshold voltage.

If the TFT 13 is turned on, it attempts to output VSS as OUT. However, the current capacities of the TFT 22 and the TFT 23 of the clocked inverter 17 holding VDD are set large, so that a theoretically proper operation is performed. As a result, as indicated by a dotted waveform 173 in the timing chart shown in FIG. 2D, a situation is prevented, in which a signal outputted as OUT is not correctly held and switching from VDD to VSS is performed earlier than a desired timing.

Also, even if a correct operation is performed as described above, when the N-type TFT 13 that should be turned off remains turned on, there arises a problem that a leak current flows between VDD and VSS and therefore the current consumption is increased. In such a case, as shown in FIG. 2C, inverters 20 and 21 may be connected to the gates of the TFT 14a and the TFT 15a. With this structure, as indicated by a dotted waveform 175 in FIG. 2D, it is possible to delay the signal SB and to delay the timing at which the P-type TFT 14a is turned on, which makes it possible to delay a timing at which a leak current flows. Note that the number of inverters to be connected is not specifically limited so long as no theoretical difference occurs, although the degree of the delay is set at equal to or less than one half of the cycle of CK.

On the other hand, if the threshold voltage (|VTH|) of the TFT 13 or the TFT 14a is equal to or more than 2 V, the TFT 13 is not turned on and no leak current is generated. If it is possible to prevent the generation of the leak current, an increase in current consumption is prevented. Also, the waveform of the output signal OUT is not turned on earlier than the desired timing. As a result, a signal having a stabilized waveform is generated.

In conclusion, the present invention having the third or fourth structure described above is very effective for the holding and provides the following effects (4) and (5).

First, the effect (4) will be described. When the threshold voltage (|VTH|) of the TFT 15b in the structure shown in FIG. 2A or the threshold voltage (|VTH|) of the TFT 14a in the structure shown in FIG. 2C is equal to or less than a desired value (2 V), multiple inverters may be connected to the input terminal of the compensation circuit 19a or 19b. With this structure, even if the threshold voltage of the TFT described above is equal to or less than the desired value, it is possible to delay the timing at which the leak current is generated.

Next, the effect (5) will be described. Conventionally, there has been a problem that a TFT that should be turned off remains turned on and a leak current flows between VDD and VSS, resulting in the increase of the current consumption. In the structure shown in FIG. 2A, for instance, the P-type TFT 11 that should be turned off remains turned on. Also, in the structure shown in FIG. 2C, the N-type TFT 13 that should be turned off remains turned on. In the present invention, however, when the threshold voltage (|VTH|) of the TFT 11 or the TFT 15b in the structure shown in FIG. 2A or the threshold voltage (|VTH|) of the TFT 13 or the TFT 14a in the structure shown in FIG. 2C is equal to or more than the desired value (2 V), it is possible to suppress the generation of the leak current.

Also, as in the case of the first and second structures, the present invention having the third or fourth structure described above provides the advantageous effects (2) and (3) described above.

Figure 2B:
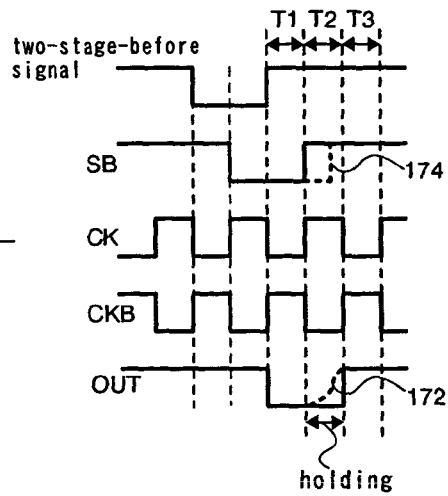
Figure 2C:
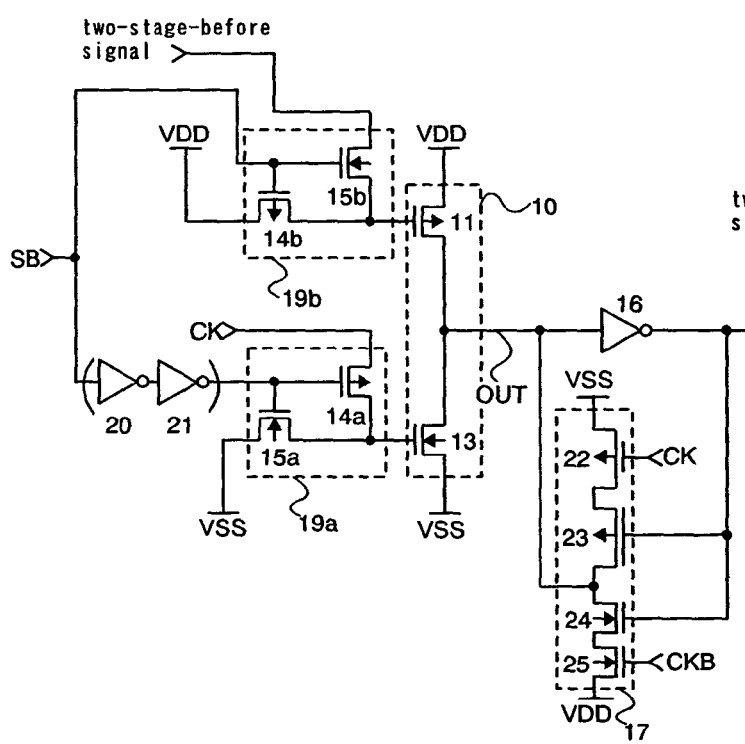

In the structure shown in FIGS. 2A and 2B, however, in order to perform a theoretically proper operation even if the TFT 11 is turned on, the current capacities of the TFTs 24 and 25 in the holding clocked inverter are set large. Therefore, there occurs a case in which even when time advances from the period T2 to the period T3 and CK is switched to the L level, the OUT is not switched to VDD and the shift register does not operate properly.

In view of this, a structure that is capable of obtaining a stabilized waveform of OUT in the holding period and is effective for the rising from the period T2 to the period T3 will be proposed as a fifth structure of the present invention.

Figure 3A:
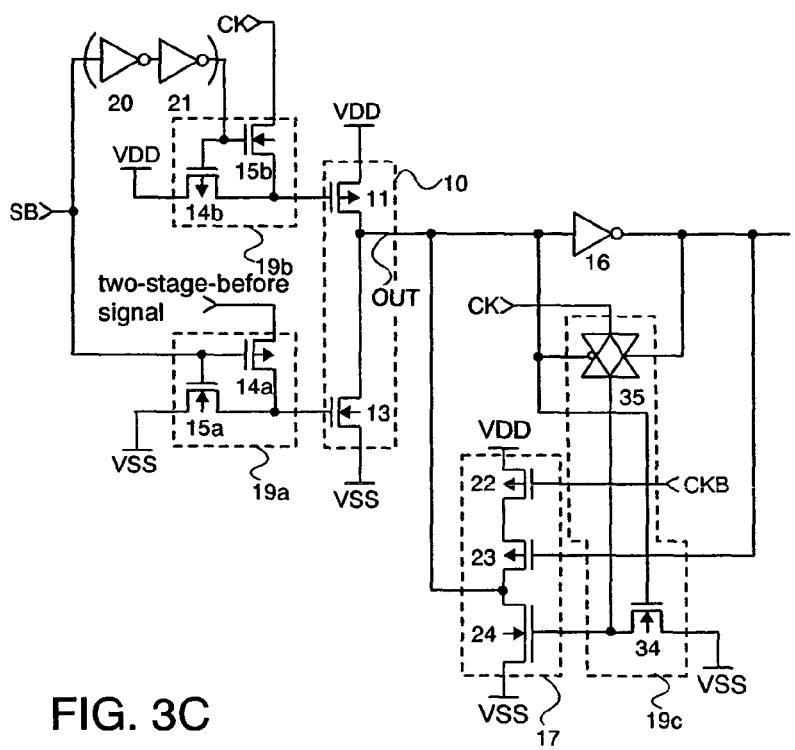
FIGS. 3A to 3D are circuit diagrams of one stage of a shift register and timing charts.

The fifth structure of the present invention will be described with reference to FIG. 3A. FIG. 3A is a circuit diagram showing structural elements of a shift register arranged at the n-th stage. Each stage is formed by a clocked inverter 10 including TFTs 11 and 13 connected in series, a compensation circuit 19a including TFTs 14a and 15a, a compensation circuit 19b including TFTs 14b and 15b, an inverter 16, a clocked inverter 17 including TFTs 22 to 24 connected in series, and a compensation circuit 19c including an N-type TFT 34 and an analog switch 35. A shift register is formed by cascade-connecting the respective stages, in which these circuits are arranged, with CK and CKB being alternately inputted at the respective stages. The differences from FIG. 2A reside in that the TFT 25 is eliminated from the holding clocked inverter 17, the output from the compensation circuit 19c is connected to the gate of the TFT 24, the input terminal of the inverter 16 (that is, the output terminal of the clocked inverter 10) is connected to the gate of the TFT 34 of the compensation circuit 19c and to the gate on the P-type TFT side of the analog switch 35, the output of the inverter 16 is connected to the gate on the N-type TFT side of the analog switch 35, VSS is connected to the source of the TFT 34, and CK is connected to the source of the analog switch 35.

The gate of the TFT 22 is connected to a clock bar signal line and receives CKB, and the gate of the TFT 23 receives the output of the inverter 16. Also, the current performance of the TFT 24 is set large. In more detail, if it is assumed that "$W_{24}/L:W_{11}/L=x:y$", $W_{24}/L$ of the TFT 24 and $W_{11}/L$ of the TFT 11 are respectively set as "y=1, x≧1" (where W is a gate width and L is a gate length).

Figure 3B:
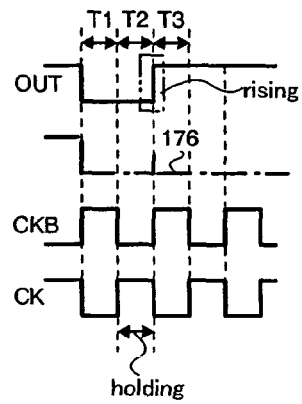

Operations in periods T1 to T3 will be described by following a timing chart shown in FIG. 3B. In the period T1, VSS is outputted from the clocked inverter 10.

Next, the operation in the period T2 will be described. In the clocked inverter 17, CKB (L level, 2 V) is inputted to the gate of the TFT 22 and the TFT 22 is turned on. The inverted signal (VDD) of OUT is inputted to the gate of the TFT 23 and the TFT 23 is turned off. The output OUT (VSS) is inputted to the gate of the TFT 34 and the TFT 34 is turned off. The signal CK (H level, 5 V) is inputted to the gate of the TFT 24 via the analog switch 35 and the TFT 24 is turned on. Under this condition, the TFT 23 is turned off and the TFT 24 is turned on, so that VSS is outputted.

Also, in the clocked inverter 10, the TFT 11 is turned on or off. Even if the TFT 11 is turned on, the current performance of the TFT 24 is set large, so that VSS is outputted with stability in the period T2.

It is desired that when time advances from the period T2 to the period T3, the output of the clocked inverter 10 be switched from VSS to VDD with precision. However, the current performance of the N-type TFT 24 is set large, so that as indicated by a waveform 176 in the timing chart shown in FIG. 3B, there arises a case where it is impossible to perform the switching from VSS to VDD and the shift register does not operate properly. In the present invention, however, the following countermeasures are taken in order to prevent such a situation.

When the time advances from the period T2 to the period T3, the clocked inverter 10 attempts to switch its output from VSS (0 V) to VDD (7 V). However, the current performance of the N-type TFT 24 possessed by the clocked inverter 17 is set large, so that such a case arises, in which although |VGS| applied to the TFT 11 changes from 2 V to 5 V and an attempt is made to output VDD as OUT, it is impossible to increase the output from 0 V to 7 V. In this case, the output of the inverter 16 does not become 0 V, and 7 V is continuously inputted to the holding clocked inverter 17. As a result, the on/off states of the TFT 23 and the TFT 24 are not interchanged and VSS (0 V) is continuously outputted as OUT, which means that the shift register does not operate properly.

In the present invention, however, even if the output of the clocked inverter 10 is not switched from VSS (0 V) to VDD (7 V), if the output OUT changes by a degree at least equal to the threshold value of the TFT 34 at the moment of changing of VGS applied to the TFT 11 from 2 V to 5 V, the TFT 34 is turned on and the TFT 24 is compulsively turned off. As a result, it is possible for the TFT 11 to raise the output OUT to VDD without being influenced by the TFT 24. In addition, the rising of OUT can be performed at desired timing. Also, when the TFT 35 is replaced with an analog switch, the L level of CK is inputted to the gate of the TFT 24 at this point of time. If the threshold value of the TFT 24 is equal to or more than 2 V, the TFT 24 is turned off. Also, even if the threshold value is equal to or less than 2 V and the TFT 24 is turned on, |VGS| is reduced from 5 V to 2 V, so that the holding ability is weakened. As a result, the output OUT changes easily.

The current performance of the TFT 24 is also ascribable to the threshold value. Therefore, it is conceivable that when the threshold value of the N-type TFT is lowered and the current performance of the TFT 24 is enhanced, the threshold value of the TFT 34 having the same polarity is lowered. As a result, the turning-on is performed even if the changing degree of OUT is small. In contrast to this, even if the threshold value of the TFT 34 is high, the threshold value of the TFT 24 is also high in this case and the holding ability is weakened. As a result, a proper operation is performed without any problems.

In conclusion, the present invention having the fifth structure described above is very effective for the holding and rising and provides the following effects (6) and (7).

First, the effect (6) will be described. In the present invention, the current performance of the N-type TFT 24 possessed by the clocked inverter 17 is set large. When VSS is held by a loop formed by the inverter 16 and the clocked inverter 17, the current performance of the TFT 24 is set large, so that it is possible to output VSS with stability.

Next, the effect (7) will be described. At the rising of the output of the clocked inverter 10 from VSS to VDD, the current performance of the N-type TFT 24 possessed by the clocked inverter 17 is set large, so that there arises a case in which the rising is not performed and a proper operation is not performed. However, the timing of this rising is determined by the P-type TFT 11 possessed by the clocked inverter 10. If the output OUT changes at the moment of changing of VGS of the TFT 11, the N-type TFT 34 is turned on at the time when its threshold value is exceeded. As a result, the output OUT rises with precision.

Figure 2D:
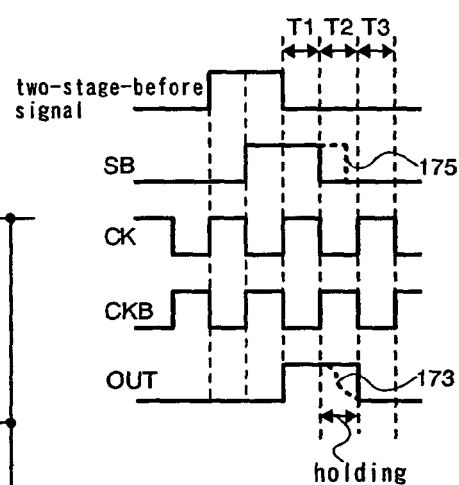

Similarly in FIGS. 2C and 2D, there arises a case in which even when time advances from the period T2 to the period T3 and CK is switched to the H level, the OUT is not switched to VSS and the shift register does not operate properly.

In view of this, a structure that is capable of obtaining a stabilized waveform of OUT in the holding period and is effective for the rising from the period T2 to the period T3 will be proposed as a sixth structure of the present invention.

Figure 3C:
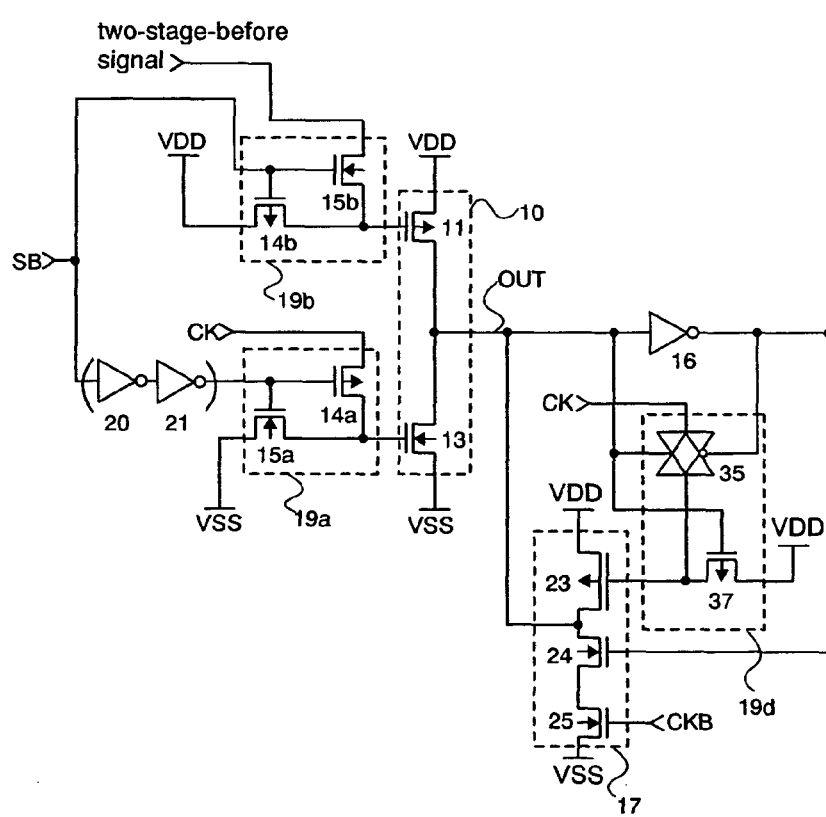

The sixth structure of the present invention will be described with reference to FIG. 3C. FIG. 3C is a circuit diagram showing structural elements of a shift register arranged at the n-th stage. Each stage is formed by a clocked inverter 10 including TFTs 11 and 13 connected in series, a compensation circuit 19*a* including TFTs 14*a* and 15*a*, a compensation circuit 19*b* including TFTs 14*b* and 15*b*, an inverter 16, a clocked inverter 17 including TFTs 23 to 25 connected in series, and a compensation circuit 19*d* including an P-type TFT 37 and an analog switch 35. A shift register is formed by cascade-connecting the respective stages, in which these circuits are arranged, with CK and CKB being alternately inputted at the respective stages. The differences from FIG. 2C are that the TFT 22 is eliminated from the holding clocked inverter 17, the output from the compensation circuit 19*d* is connected to the gate of the TFT 23, the input terminal of the inverter 16 (that is, the output terminal of the clocked inverter 10) is connected to the gate of the P-type TFT 37 of the compensation circuit 19*d* and to the gate on the N-type TFT side of the analog switch 35, the output of the inverter 16 is connected to the gate on the P-type TFT side of the analog switch 35, VDD is connected to the source of the TFT 37, and CK is connected to the source of the analog switch 35.

The gate of the TFT 25 is connected to a clock bar signal line and receives CK, and the gate of the TFT 37 receives the output (OUT) of the clocked inverter 10. Also, the current performance of the TFT 23 is set large. In more detail, if it is assumed that "$W_{23}/L:W_{13}/L=x:y$", $W_{23}/L$ of the TFT 23 and $W_{13}/L$ of the TFT 13 are respectively set as "$y=1$, $x \geq 1$" (where W is a gate width and L is a gate length).

Figure 3D:
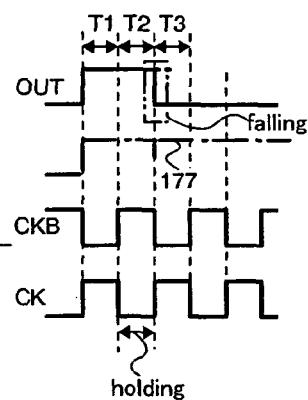

Operations in periods T1 to T3 will be described with reference to a timing chart shown in FIG. 3D. In the period T1, VDD is outputted from the clocked inverter 10.

Next, an operation in the period T2 will be described. In the clocked inverter 17, CKB (H level, 5 V) is inputted to the gate of the TFT 25 and the TFT 25 is turned on. The inverted signal (VSS) of OUT is inputted to the gate of the TFT 24 and the TFT 24 is turned off. The output OUT (VDD) is inputted to the gate of the TFT 37 and the TFT 37 is turned off. The signal CK (L level, 2 V) is inputted to the gate of the TFT 23 via the analog switch 35 and the TFT 23 is turned on. Under this condition, the TFT 24 is turned off and the TFT 23 is turned on, so that VDD is outputted.

Also, in the clocked inverter 10, the TFT 13 is turned on or off. Even if the TFT 13 is turned on, the current performance of the TFT 23 is set large, so that VDD is outputted with stability in the period T2.

It is desired that when time advances from the period T2 to the period T3, the output of the clocked inverter 10 be switched from VDD to VSS with precision. However, the current performance of the P-type TFT 123 is set large, so that as indicated by a waveform 177 in the timing chart shown in FIG. 3D, there arises a case in which it is impossible to perform the switching from VDD to VSS and the shift register does not operate properly. In the present invention, however, the following countermeasures are taken in order to prevent such a situation.

When time advances from the period T2 to the period T3, the clocked inverter 10 attempts to switch its output from VDD (7 V) to VSS (0 V). However, the current performance of the P-type TFT 23 possessed by the clocked inverter 17 is set large, so that there occurs a case in which although VGS applied to the TFT 13 changes from 2 V to 5 V and an attempt is made to output VSS as OUT, it is impossible to decrease the output from 7 V to 0 V. In this case, the output of the inverter 16 does not become 7 V, and 0 V is continuously inputted to the holding clocked inverter 17. As a result, the on/off states of the TFT 23 and the TFT 24 are not interchanged and VDD (7 V) is continuously outputted as OUT, which means that the shift register does not operate properly.

In the present invention, however, even if the output of the clocked inverter 10 is not switched from VDD (7 V) to VSS (0 V), if the output OUT changes by a degree at least equal to the threshold value of the TFT 37 at the moment of changing of VGS applied to the TFT 13 from 2 V to 5 V, the TFT 37 is turned on and the TFT 23 is compulsively turned off. As a result, it is possible for the TFT 13 to lower the output OUT to VSS without being influenced by the TFT 23.

In addition, the falling of OUT is performed at desired timing. Also, when the TFT 35 is replaced with an analog switch, the H level of CK is inputted to the gate of the TFT 23 at this point. If the threshold value of the TFT 23 is equal to or more than 2 V, the TFT 23 is turned off. Also, even if the threshold value is less than 2 V and the TFT 24 is turned on, |VGS| is reduced from 5 V to 2 V, so that the holding ability is weakened. As a result, the output OUT changes easily.

The current performance of the TFT 23 is also ascribable to the threshold value. Therefore, it is conceivable that when the threshold value of the P-type TFT is lowered and the current performance of the TFT 23 is enhanced, the threshold value of the TFT 37 having the same polarity is lowered. As a result, the turning-on is performed even if the changing degree of OUT is small. In contrast to this, even if the threshold value of the TFT 37 is large, the threshold value of the TFT 23 is also large in this case and the holding ability is weakened. As a result, a proper operation is performed without any problems.

In conclusion, the present invention having the sixth structure described above is very effective for the holding and the falling, and provides the following effects (8) and (9).

First, the effect (8) will be described. In the present invention, the current performance of the P-type TFT 23 possessed by the clocked inverter 17 is set large. When VDD is held by a loop formed by the inverter 16 and the clocked inverter 17, the current performance of the TFT 23 is set large, so that it is possible to output VDD with stability.

Next, the effect (9) will be described. At the falling of the output of the clocked inverter 10 from VDD to VSS, the current performance of the P-type TFT 23 possessed by the clocked inverter 17 is set large, so that there occurs a case in which the falling is not caused and a proper operation is not performed. However, the timing of this falling is determined by the N-type TFT 13 possessed by the clocked inverter 10. If the output OUT changes at the moment of changing of VGS of the TFT 13, the P-type TFT 37 is turned on at the time when its threshold value is exceeded. As a result, the output OUT is lowered with precision.

Embodiment Mode 2

It is possible to use the first to sixth structures described above with reference to FIGS. 1A to 1D, 2A to 2D, and 3A to 3D by freely combining them. In this embodiment mode, an example of the combination will be described with reference to FIGS. 6A and 6B and FIGS. 7A and 7B. Note that in those drawings, a signal S is a start pulse or an output of a clocked inverter 16 arranged at the (n−1)th stage, and a signal SB corresponds to the inverted signal of the signal S. Also, the term "two-stage-before signal" corresponds to the output of the clocked inverter 10 arranged at the (n−2)th stage.

Figure 6A:
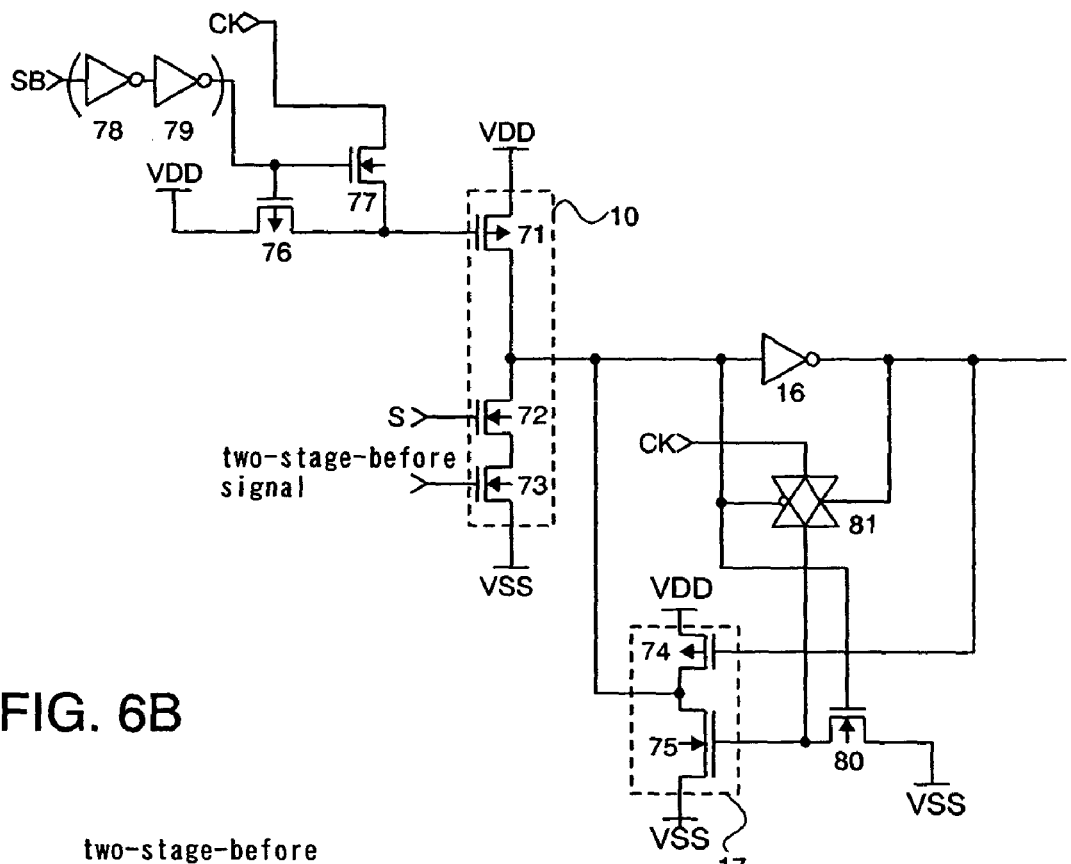
FIGS. 6A and 6B are circuit diagrams of one stage of a shift register.

FIG. 6A is a circuit diagram in which the third structure (see FIG. 2A) and the fifth structure (see FIG. 3A) are combined, and shows structural elements of a shift register arranged at the n-th stage. Each stage is formed by a clocked inverter 10 including TFTs 71 to 73 connected in series, an inverter 16, a clocked inverter 17 including TFTs 74 and 75 connected in series, TFTs 76 and 77 connected in series, inverters 78 and 79, a TFT 80, and an analog switch 81. The shift register is formed by cascade-connecting the respective stages, in which these circuits are arranged, with CK and CKB being alternately inputted at the respective stages.

Figure 6B:
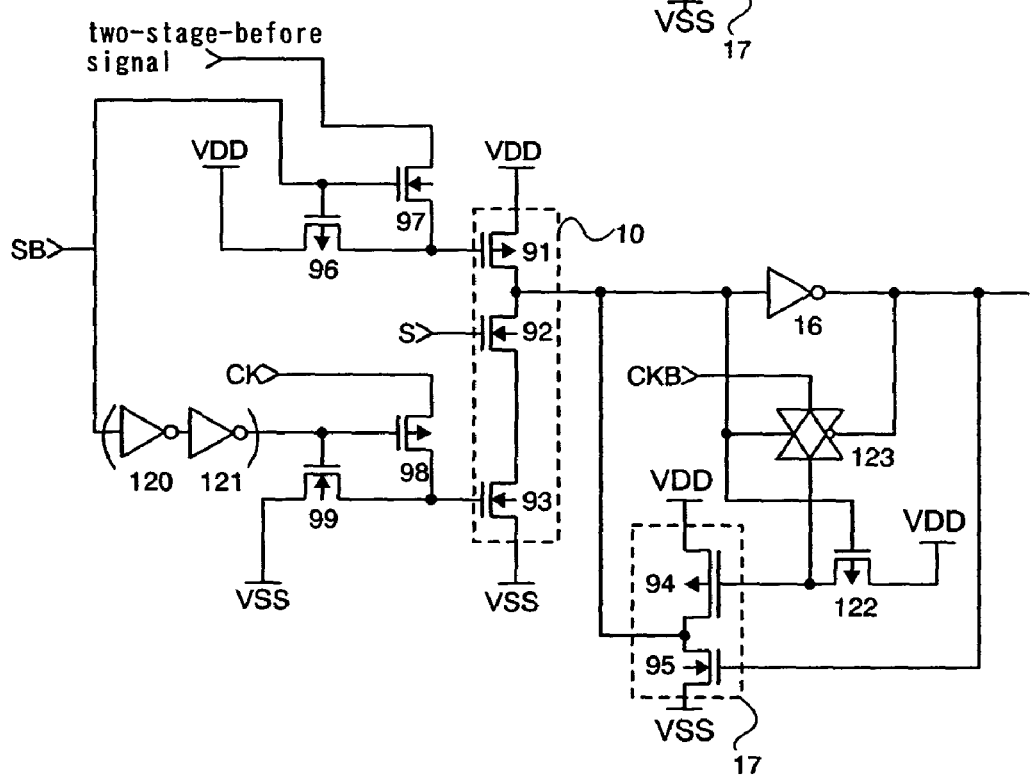

FIG. 6B is a circuit diagram in which the second structure (see FIG. 1C), the fourth structure (see FIG. 2C), and the sixth structure (see FIG. 3C) are combined with each other, and FIG. 6B shows structural elements of a shift register arranged at the n-th stage. Each stage is formed by a clocked inverter 10 including TFTs 91 to 93 connected in series, an inverter 16, a clocked inverter 17 including TFTs 94 and 95 connected in series, TFTs 96 and 97 connected in series, TFTs 98 and 99 connected in series, inverters 120 and 121, a P-type TFT 122, and an analog switch 123. The shift register is formed by cascade-connecting respective stages, in which these circuits are arranged, with CK and CKB being alternately inputted at the respective stages.

Figure 7A:
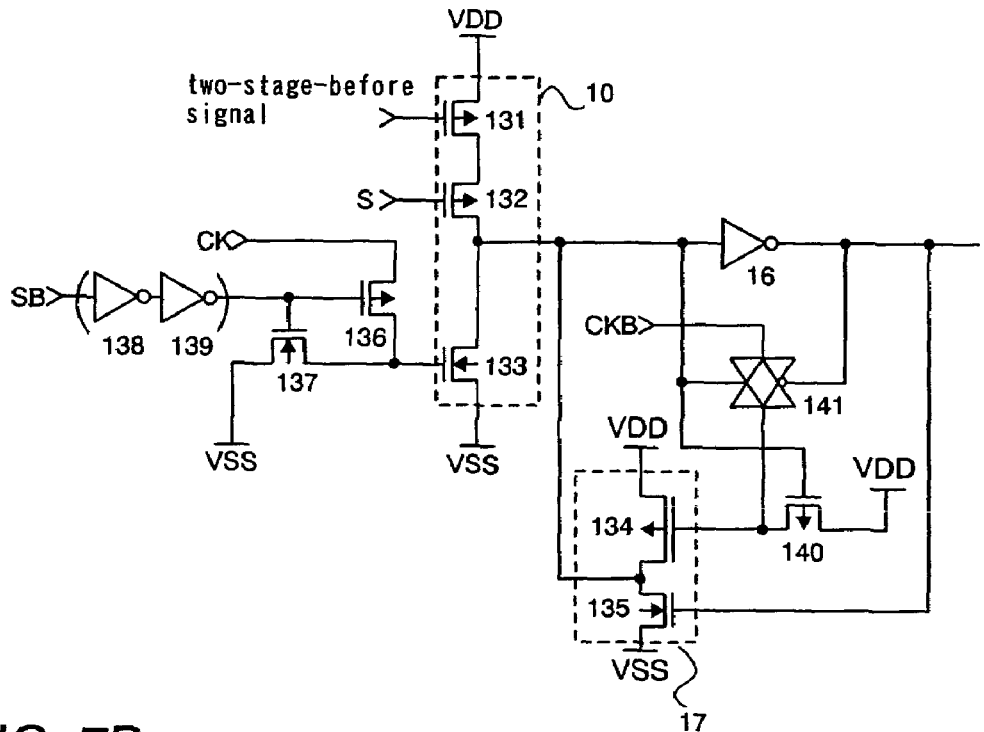
FIGS. 7A and 7B are circuit diagrams of one stage of a shift register.

FIG. 7A is a circuit diagram in which the fourth structure (see FIG. 2C) and the sixth structure (see FIG. 3C) are combined with each other, and FIG. 7A shows structural elements of a shift register arranged at the n-th stage. Each stage is formed by a clocked inverter 10 including TFTs 131 to 133 connected in series, an inverter 16, a clocked inverter 17 including TFTs 134 and 135 connected in series, TFTs 136 and 137 connected in series, inverters 138 and 139, a P-type TFT 140, and an analog switch 141. The shift register is formed by cascade-connecting the respective stages, in which these circuits are arranged, with CK and CKB being alternately inputted at the respective stages.

Figure 7B:
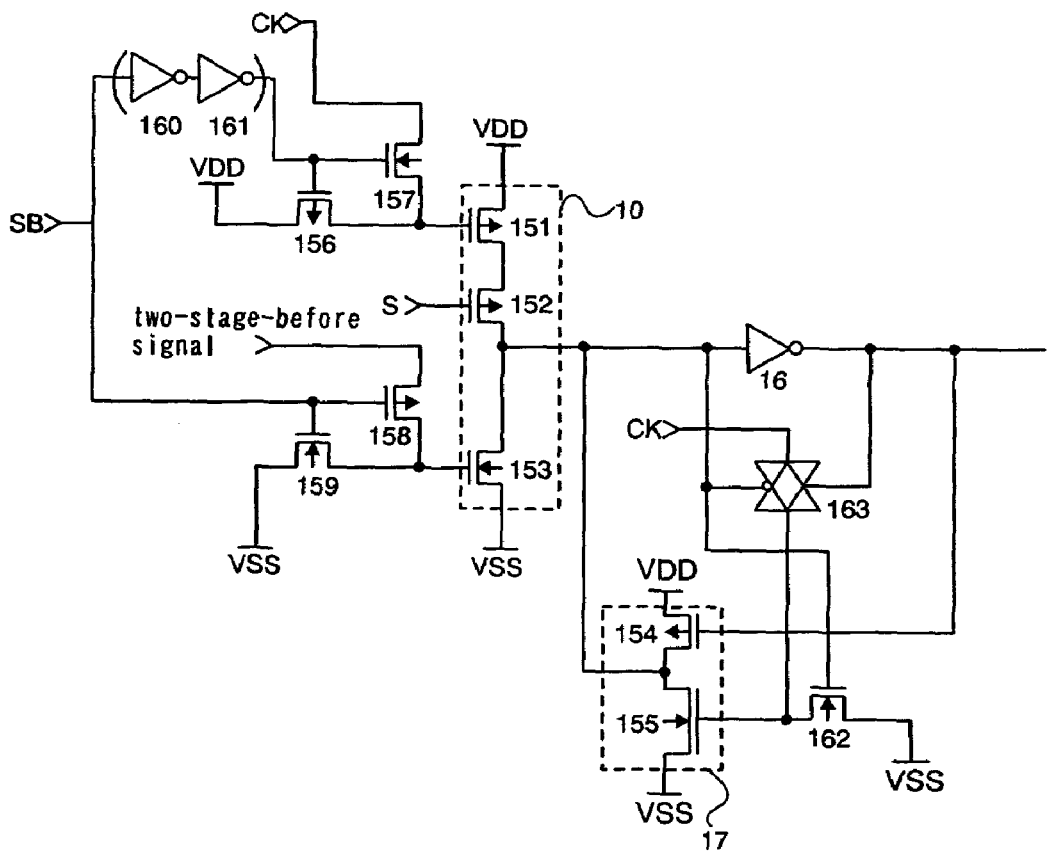

FIG. 7B is a circuit diagram in which the first structure (see FIG. 1A), the third structure (see FIG. 2A) and the fifth structure (see FIG. 3A) are combined with each other, and FIG. 7B shows structural elements of a shift register arranged at the n-th stage. Each stage is formed by a clocked inverter 10 including TFTs 151 to 153 connected in series, an inverter 16, a clocked inverter 17 including TFTs 154 and 155 connected in series, TFTs 156 and 157 connected in series, TFTs 158 and 159 connected in series, inverters 160 and 161, an N-type TFT 162, and an analog switch 163. The shift register is formed by cascade-connecting the respective stages, in which these circuits are arranged, with CK and CKB being alternately inputted at the respective stages.

It should be noted here that when some or all of the first to sixth structures described above are combined and used, unnecessary TFTs may be eliminated if the circuit operates without any troubles. In the structure shown in FIGS. 6A and 7B, the TFT 22 in FIG. 3A is indeed eliminated. Also, in the structure shown in FIGS. 6B and 7A, the TFT 25 shown in FIG. 3C is indeed eliminated. In a like manner, TFTs may be additionally arranged as necessary if no trouble occurs in its operation.

Embodiment Mode 3

This embodiment mode according to the present invention will be described with reference to FIGS. 10A and 10B.

Figure 10A:
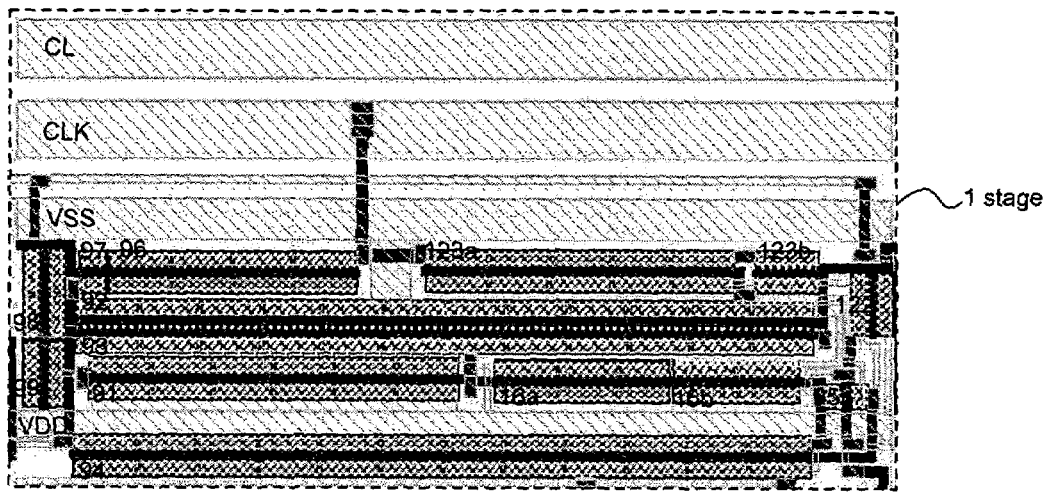
FIGS. 10A and 10B are a mask layout and a photograph of the top surface thereof.

FIG. 10A shows a plan layout view (top view) of the circuit diagram shown in FIG. 6B. FIG. 10B shows a photograph of a panel that is actually made, magnified by a light microscope.

Figure 10B:
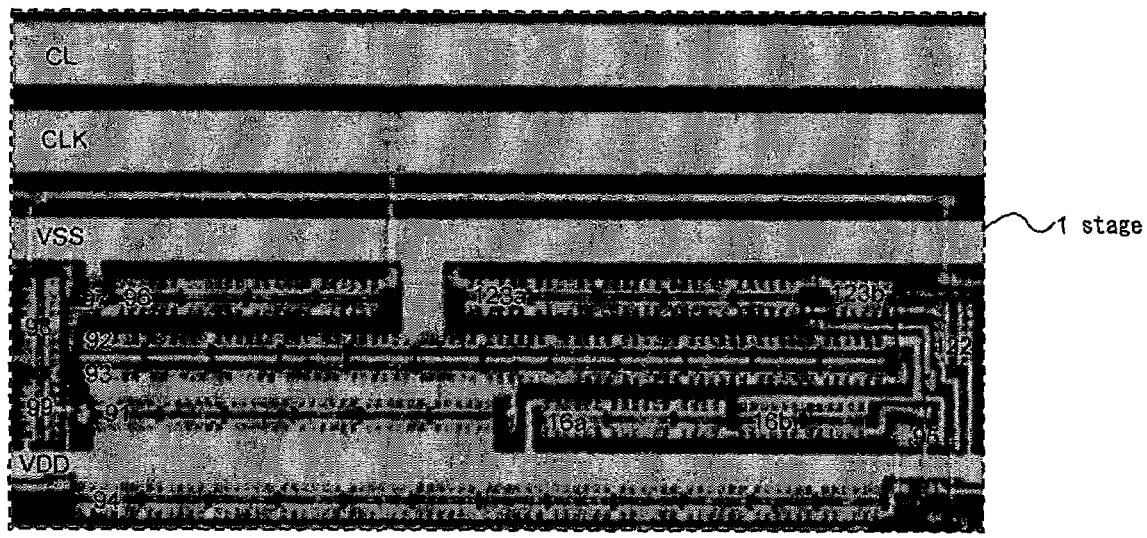
Figure 11A:
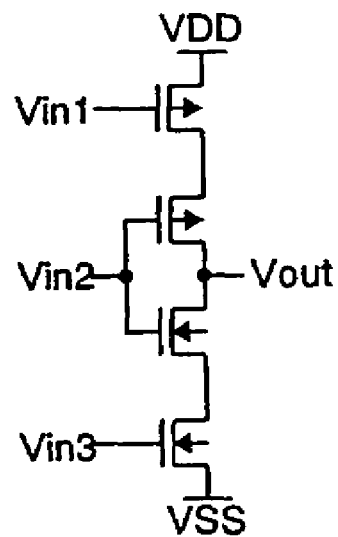
FIGS. 11A to 11D are circuit diagrams of a clocked inverter, a NAND and a NOR.
Figure 11B:
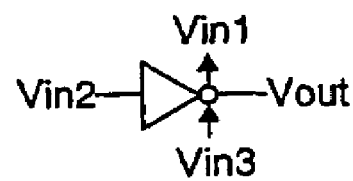
Figure 11C:
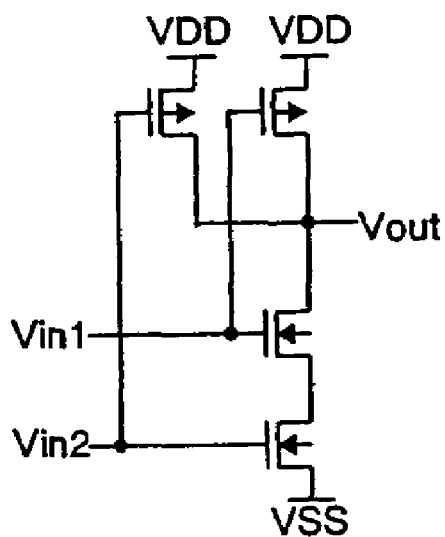
Figure 11D:
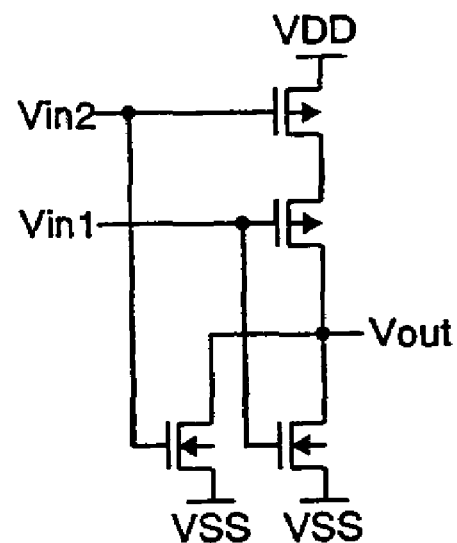

Reference numerals and symbols in FIGS. 10A and 10B correspond to those in FIG. 6B, and thus the description is omitted here. In FIGS. 10A and 10B, a P-type TFT 16a and an N-type TFT 16b constitute an inverter 16, and a P-type TFT 123a and an N-type TFT 123b constitute an analog switch 123.

The W (gate width) of the TFT 94 is set large. If another TFT that is connected with the TFT 94 in series and has the same size as the TFT 94 is required, the layout area becomes larger. However, only one TFT 94 whose W is set large is required in the present invention, and therefore the expansion of the layout area is suppressed.

Embodiment Mode 4

An embodiment mode of the present invention that is different from the above embodiment modes will be described with reference to FIGS. 4A to 4D and FIGS. 5A to 5D.

Figure 4A:
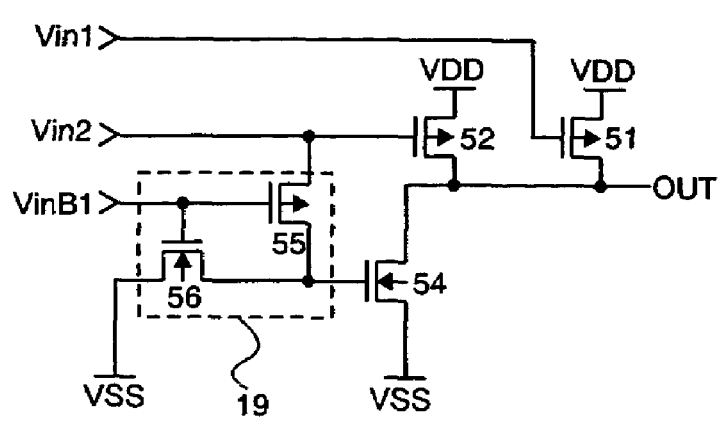
FIGS. 4A to 4D are NAND circuit diagrams and timing charts.

A NAND of the present invention will be described with reference to FIGS. 4A to 4D. FIG. 4A is a circuit diagram of the NAND that includes P-type TFTs 51 and 52 connected in parallel, an N-type TFT 54, and a compensation circuit 19 including a P-type TFT 55 and an N-type TFT 56 connected in series. The gate of the TFT 51 receives Vin1, the gate of the TFT 52 and the source of the TFT 55 receive Vin2, and the gates of the TFTs 55 and 56 receive VinB1 that is the inverted signal of Vin1.

Figure 4B:
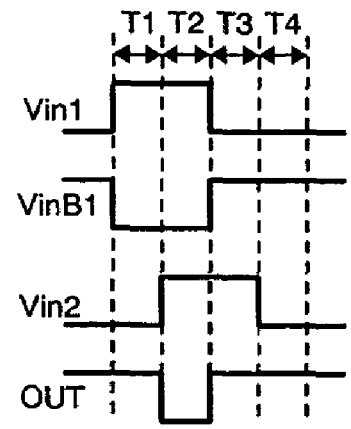

How this NAND operates will be described by following a timing chart shown in FIG. 4B. In the period T1, Vin1 is at the H level, VinB1 is at the L level, and Vin2 is at the L level, so that the TFT 51 is turned off, the TFT 52 is turned on, the TFT 55 is turned on, and the TFT 56 is turned off. Also, Vin2 (at the L level) is inputted to the TFT 54 via the TFT 55, so that the TFT 54 is turned off. As a result, the output OUT assumes VDD. In the period T2, Vin1 remain at the H level, VinB1 remains at the L level, and Vin2 is switched to the H level, so that the TFT 51 remains turned off, the TFT 52 is turned off, the TFT 55 remains turned on, and the TFT 56 remains turned off. Also, VinB1 (at the L level) is inputted to the TFT 54 via the TFT 55, so that the TFT 54 is turned on. As a result, the output OUT assumes VSS.

In the period T3, Vin1 is switched to the L level, VinB1 is switched to the H level, and Vin2 remains at the H level, so that the TFT 51 is turned on, the TFT 52 remains turned off, the TFT 55 is turned off, and the TFT 56 is turned on. Also, VSS is inputted to the TFT 54 via the TFT 56, so that the TFT 54 is turned off. As a result, the output OUT assumes VDD. In the period T4, Vin1 remains at the L level, VinB1 remains at the H level, and Vin2 is switched to the L level, so that the TFT 51 remains turned on, the TFT 52 is turned on, the TFT 55 remains turned off, and the TFT 56 remains turned on. Also, VSS is inputted to the TFT 54 via the TFT 56, so that the TFT 54 remains turned off. As a result, the output OUT assumes VDD.

Next, a structure in which an analog switch 57 is arranged in place of the TFT 55 in the structure described above is shown in FIG. 4C. The structure shown in FIG. 4C operates by following a timing chart shown in FIG. 4D. Note that the structure shown in FIG. 4C and the operation thereof is similar to the structure shown in FIG. 4A and the operation thereof described above, and therefore will not be described here.

Figure 5A:
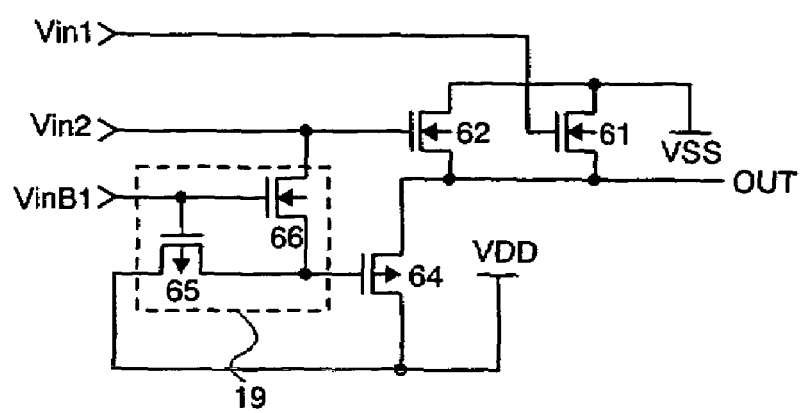
FIGS. 5A to 5D are NOR circuit diagrams and timing charts.

Next, a NOR of the present invention will be described with reference to FIGS. 5A to 5D. FIG. 5A is a circuit diagram of the NOR which includes N-type TFTs 61 and 62 connected in parallel, a P-type TFT 64, and a compensation circuit 19 including a P-type TFT 65 and an N-type TFT 66 connected in series. The gate of the TFT 61 receives Vin1 the gate of the TFT 62 and the source of the TFT 66 receive Vin2, and the gates of the TFTs 65 and 66 receive VinB1 that is the inverted signal of Vin1.

Figure 5B:
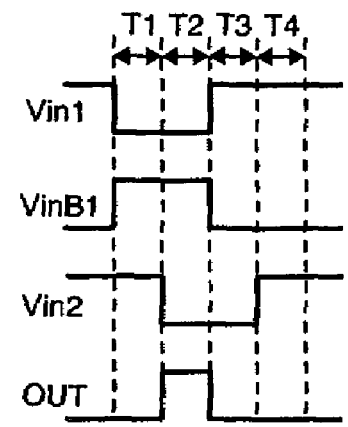

How the NOR operates will be described with reference to a timing chart shown in FIG. 5B. In the period T1, Vin1 is at the L level, VinB1 is at the H level, and Vin2 is at the H level, so that the TFT 61 is turned off, the TFT 62 is turned on, the TFT 65 is turned off, and the TFT 66 is turned on. Also, Vin2 (at the H level) is inputted to the TFT 64 via the TFT 66, so that the TFT 64 is turned off. As a result, the output OUT assumes VSS. In the period T2, Vin1 remains at the L level, VinB1 remains at the H level, and Vin2 is switched to the L level, so that the TFT 61 remains turned off, the TFT 62 is turned off, the TFT 65 remains turned off, and the TFT 66 remains turned on. Also, Vin2 (at the L level) is inputted to the TFT 64 via the TFT 66, so that the TFT 64 is turned on. As a result, the output OUT assumes VDD.

In the period T3, Vin1 is switched to the H level, VinB1 is switched to the L level, and Vin2 remains at the L level, so that the TFT 61 is turned on, the TFT 62 remains turned off, the TFT 65 is turned on, and the TFT 66 is turned off. Also, VDD is inputted to the TFT 64 via the TFT 65, so that the TFT 64 is turned off. As a result, the output OUT assumes VSS. In the period T4, Vin1 remains at the H level, VinB1 remains at the L level, and Vin2 is switched to the H level, so that the TFT 61 remains turned on, the TFT 62 is turned on, the TFT 65 remains turned on, and the TFT 66 remains turned off. Also, VDD is inputted to the TFT 64 via the TFT 65, so that the TFT 64 remains turned off. As a result, the output OUT assumes VSS.

Next, a structure in which an analog switch 67 is arranged in place of the TFT 66 in the structure described above is shown in FIG. 5C. The structure shown in FIG. 5C operates by following a timing chart shown in FIG. 5D. Note that the structure shown in FIG. 5C and the operation thereof are similar to the structure shown in FIG. 5A and the operation thereof described above, and therefore are not described here.

Figure 4C:
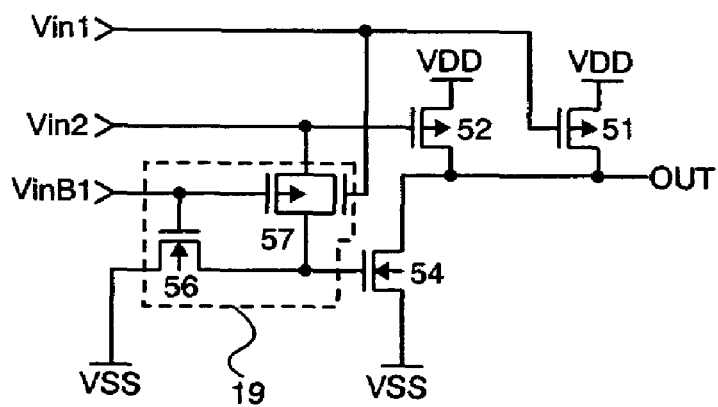
Figure 4D:
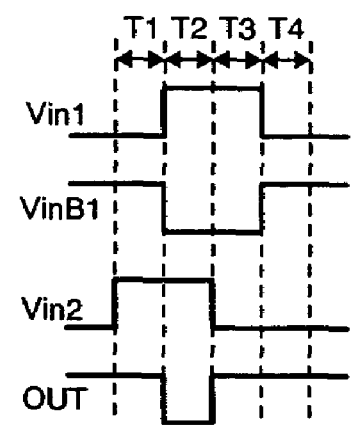
Figure 5C:
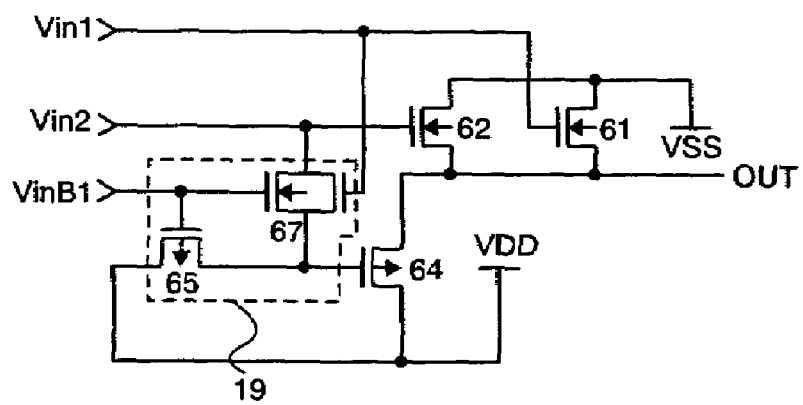
Figure 5D:
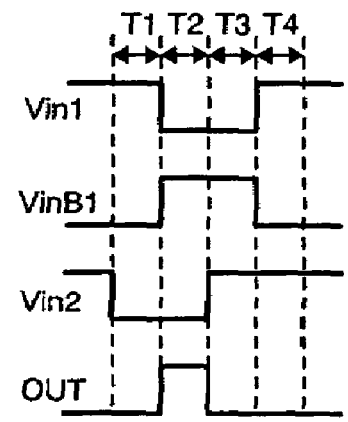

The NAND of the present invention having the structure shown in FIG. 4A or 4C described above and the NOR of the present invention having the structure shown in FIG. 5A or 5C described above provide the following advantageous effect (10).

The effect (10) will be described. In usual cases, the NAND and NOR are each formed by four TFTs that are two N-type TFTs connected in series and two P-type TFTs connected in series. Also, in order to obtain a large on-current, the gate widths (W) of the two TFTs connected in series are set large. As a result, it is required to increase the gate width of the TFT whose gate functions as a load, which increases the overall load and obstructs a high frequency operation. In the present invention, however, a double-gate TFT (two TFTs connected in series) is changed into a single-gate TFT. In the structure shown in FIG. 4A, for instance, it has conventionally been required to arrange two N-type TFTs connected in series. Only one N-type TFT 13, however, is arranged in the present invention. As a result, in the present invention, it is not required to increase the gate width of the TFT and it is possible to reduce the size of the TFT, which makes it possible to realize a high integration. Further, the burden on an element, whose gate (gate capacitance) functions as a load, is reduced and therefore the overall load is also reduced. As a result, a high frequency operation becomes possible.

In this embodiment mode, although the NAND and NOR have been described with reference to FIGS. 4A to 4D and FIGS. 5A to 5D, the present invention is applicable to other circuits. However, it is preferable that the present invention is applied to a circuit that uses at least two signals.

Embodiment Mode 5

This embodiment mode according to the present invention will be described with reference to FIGS. 8A to 8C.

Figure 8A:
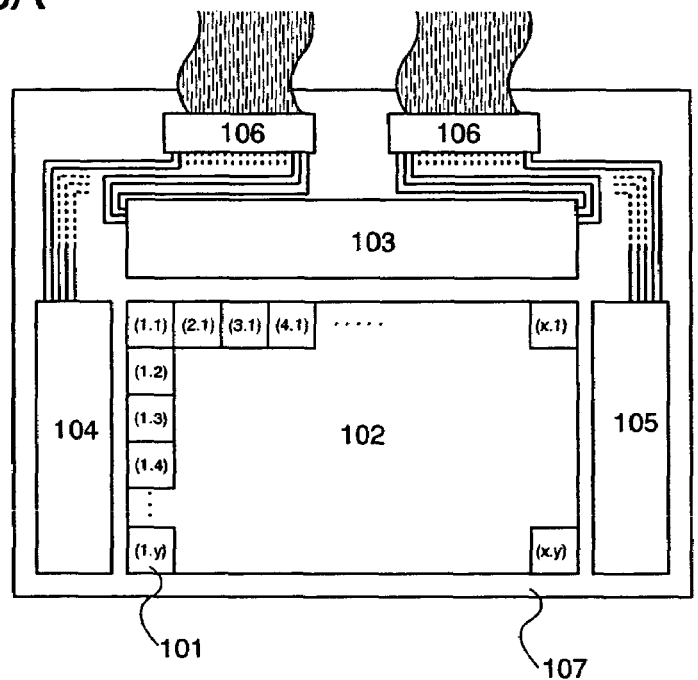
FIGS. 8A to 8C show a panel.

FIG. 8A shows appearance of a display device. The display device has a pixel portion 102 in which (x×y) pixels 101 are arranged in a matrix on a substrate 107. A signal line driver circuit 103, a first scanning line driver circuit 104 and a second scanning line driver circuit 105 are arranged on the periphery of the pixel portion 102. A signal is externally supplied to the signal line driver circuit 103, the first scanning line driver circuit 104, and the second scanning line driver circuit 105 through a FPC 106. In addition, the signal line driver circuit 103, the first scanning line driver circuit 104 and the second scanning line driver circuit 105 may be provided outside the substrate 107 in which the pixel portion 102 is formed. In FIG. 8A, one signal line driver circuit and two scanning driver circuits are provided, but the numbers of signal line driver circuit and scanning line driver circuit are not limited thereto. The numbers of them can be set arbitrarily corresponding to a structure of the pixel 101. Note that a display device in the present invention includes a panel in which a pixel portion and a driver circuit are sealed between a substrate and a cover material, a module in which an IC and the like are mounted on the panel, and a display.

Figure 8B:
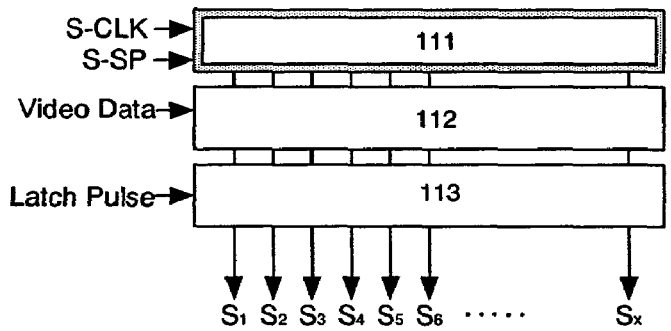
Figure 8C:
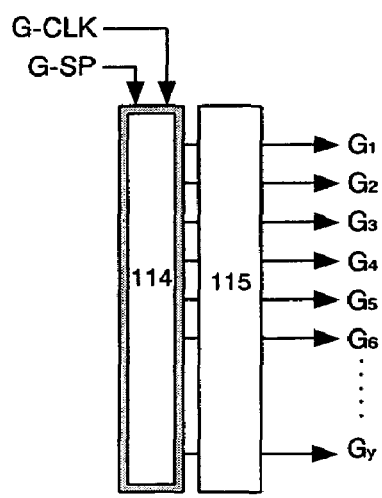

FIG. 8B shows an example of a structure of the signal line driver circuit 103. The signal line driver circuit 103 has a shift register 111, a first latch circuit 112, and a second latch circuit 113. FIG. 8C shows an example of a structure of the first scanning line driver circuit 104. The first scanning line driver circuit 104 has a shift register 114 and a buffer 115. Any one of the structures shown in FIGS. 1A to 3D, 6A to 7B is freely applied to the shift register 111 or the shift register 114. Any one of the structures shown in FIGS. 4A to 5D or another circuit according to the present invention is freely applied to the first latch circuit 112, the second latch circuit 113 or the buffer 115.

This embodiment mode can be freely combined with Embodiment Modes 1 to 4.

Embodiment Mode 6

The following are examples of electronic appliances to which the present invention is applied: video cameras, digital cameras, goggle type displays (head mounted display), navigation systems, audio playback units (car audios, audio components, etc.), notebook type personal computers, game machines, portable information terminals (mobile computers, mobile telephones, mobile type game machines, electronic books, etc.), image playback units equipped with a recording medium (specifically, devices equipped with displays each of which is capable of playing a recording medium such as a digital versatile disk (DVD) and displaying the image thereof), and the like.

Figure 9A:
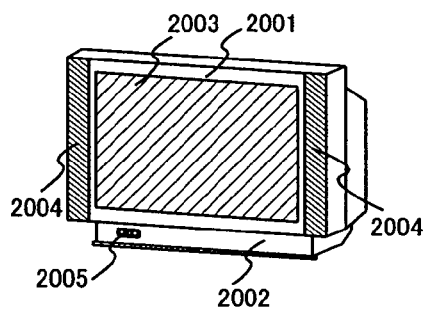
FIGS. 9A to 9H show electronic appliances according to the present invention.

FIG. 9A shows a light emitting device, which includes a casing 2001, a support base 2002, a display portion 2003, a speaker portion 2004, a video input terminal 2005 and the like. The present invention can be applied to a driver circuit of the display portion 2003. The light emitting device shown in FIG. 9A can be completed according to the present invention. The light emitting device have a thinner display portion than a liquid crystal display device, since the light emitting device is a self-luminous and does not need a backlight. Note that all display devices for display information, for example, personal computers, devices for receiving TV broadcasting, and devices for displaying advertising, are also included in the light emitting device.

Figure 9B:
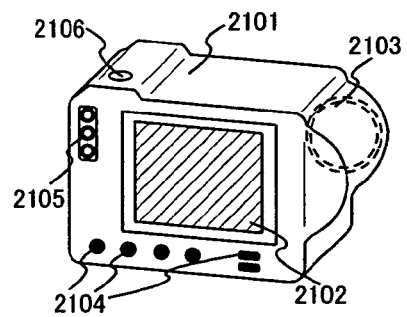

FIG. 9B shows a digital still camera, which includes a main body 2101, a display portion 2102, an image-receiving portion 2103, operation keys 2104, an external connection port 2105, a shutter 2106 and the like. The present invention can be applied to a driver circuit of the display portion 2102. The digital still camera shown in FIG. 9B is completed according to the present invention.

Figure 9C:
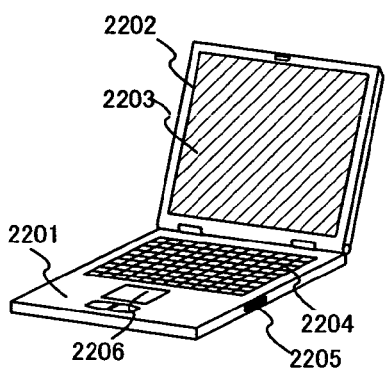

FIG. 9C shows a notebook type personal computer, which includes a main body 2201, a casing 2202, a display portion 2203, a keyboard 2204, external connection ports 2205, a pointing mouse 2206, and the like. The present invention can be applied to a driver circuit of the display portion 2203. The notebook type personal computer shown in FIG. 9C is completed according to the present invention.

Figure 9D:
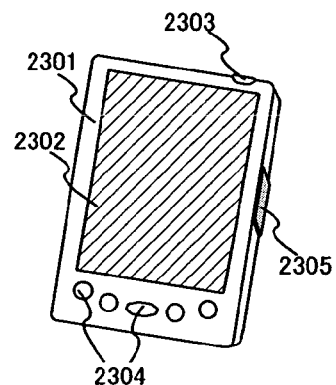

FIG. 9D shows a mobile computer, which includes a main body 2301, a display portion 2302, switches 2303, operation keys 2304, an infrared port 2305, and the like. The present invention can be applied to a driver circuit of the display portion 2302. The mobile computer shown in FIG. 9D is completed according to the present invention.

Figure 9E:
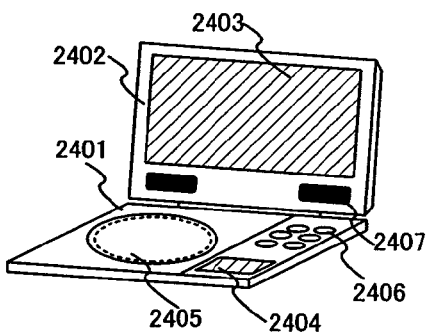

FIG. 9E shows a portable image playback unit provided with a recording medium (specifically, a DVD player), which includes a main body 2401, a casing 2402, a display portion A 2403, a display portion B 2404, a recording medium (such as a DVD) read-in portion 2405, operation keys 2406, a speaker portion 2407, and the like. The display portion A 2403 mainly displays image information, and the display portion B 2404 mainly displays character information. The present invention can be applied to driver circuits of the display portions A 2403 and B 2402. Note that image playback units provided with a recording medium include game machines for domestic use or the like. The image playback unit shown in FIG. 9E are completed according to the present invention.

Figure 9F:
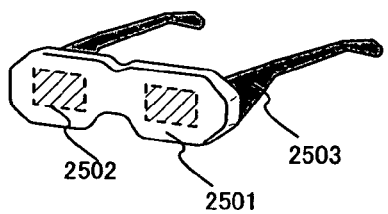

FIG. 9F shows a goggle type display (head mounted display), which includes a main body 2501, a display portion 2502, an arm portion 2503, and the like. The present invention can be applied to a driver circuit of the display portion 2502. The goggle type display shown in FIG. 9F is completed according to the present invention.

Figure 9G:
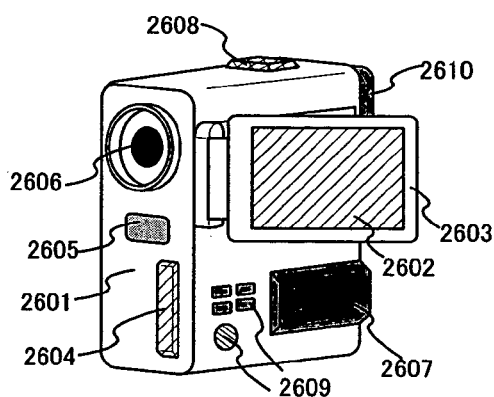

FIG. 9G shows a video camera, which includes a main body 2601, a display portion 2602, a casing 2603, external connection ports 2604, a remote-controlled receiving portion 2605, an image receiving portion 2606, a battery 2607, an audio input portion 2608, operation keys 2609, an eye piece 2610, and the like. A pixel portion provided with a light emitting element formed according to the present invention may be applied to the display portion 2602. The video camera shown in FIG. 9G is completed according to the present invention.

Figure 9H:
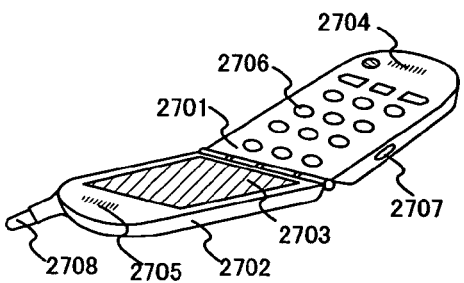

FIG. 9H shows a mobile telephone, which includes a main body 2701, a casing 2702, a display portion 2703, an audio input portion 2704, an audio output portion 2705, operation keys 2706, external connection ports 2707, an antenna 2708, and the like. The present invention can be applied to a driver circuit of the display portion 2703. Note that by displaying white characters on a black background in the display portion 2703, the power consumption of the mobile telephone can be reduced. The mobile phone shown in FIG. 9H is completed according to the present invention.

In addition, miniaturization of casings for electronic appliances, reduction of an area occupied by a driver circuit in an internal circuit, reduction of manufacturing costs, reduction of power consumption, and a high frequency operation are realized according to the present invention. The present invention can give synergistic effects to all the above electronic appliances and further, greater synergistic effects to mobile terminals in particular.

As described above, the present invention can be widely applied to and used in electronic appliances in various fields.

Further, the electronic appliances of this embodiment mode may employ any one of the pixel structures of Embodiment Modes 1 to 5.

Embodiment Mode 7

Figure 12A:
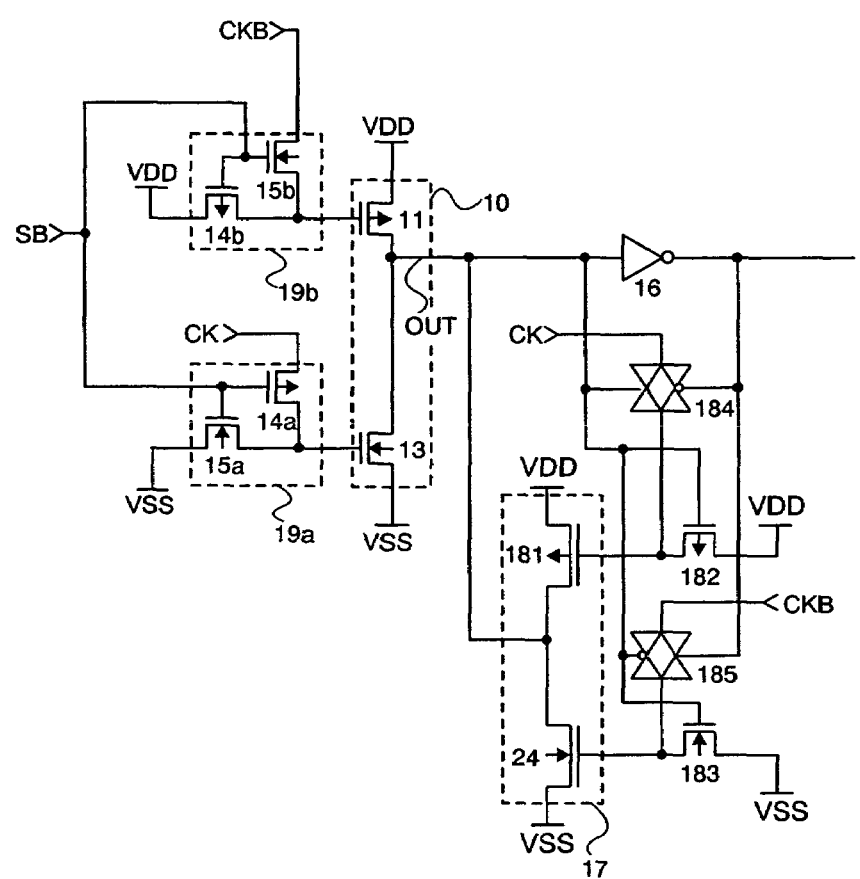
FIGS. 12A and 12B are a circuit diagram of one stage of a shift register and a timing chart, respectively.
Figure 12B:
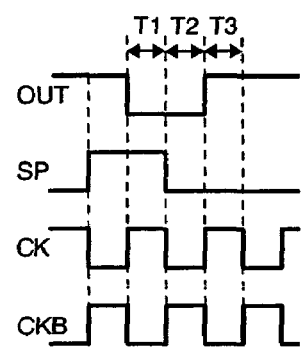

A seventh structure of the present invention will be described with reference to FIGS. 12A and 12B. FIG. 12A is a circuit diagram showing structural elements of a shift register arranged in the n-th stage. Each stage is formed by a clocked inverter 10 including TFTs 11 and 13 connected in series, a compensation circuit 19a including TFTs 14a and 15a, a compensation circuit 19b including TFTs 14b and 15b, a holding clocked inverter 17 including TFTs 24 and 181 connected in series, a compensation circuit including TFT 182 and an analog switch 184, and a compensation circuit including TFT 183 and an analog switch 185. The shift register is formed by cascade-connecting the respective stages, in which these circuits are arranged, with signals from CK and CKB being alternately inputted at the respective stages. This structure in FIG. 12A is different from the structure in FIG. 3A in that CKB is input to the source of TFT 14a instead of inputting two-stage-before signal, TFT 181 is arranged in the holding clocked inverter 17 instead of arranging TFTs 22 and 23, the compensation circuit comprising the TFT 182 and the analog switch 184 is connected to a gate of the TFT 181, and the compensation circuit comprising the TFT 183 and the analog switch 185 is connected to a gate of the TFT 24.

Operations during periods T1 to T3 will be described using a timing chart shown in FIG. 12B. In the period T1, VSS is output from the clocked inverter 10.

Next, the operation during the period T2 is described here. VDD is input to a gate of the TFT 181 to turn off in the clocked inverter 17. The TFT 24 is on-state. Accordingly, VSS is output as OUT. In addition, in the clocked inverter 10, the TFT 11 is on-state or off-state. Even if the TFT 11 is on-state, VSS is output stably as OUT during the period T2 since the TFT 24 has a high current performance.

In the above structure, it is not necessary to use a two-stage-before signal as the structures shown in FIGS. 3A and 3C. Therefore, the number of leading out wirings can be reduced. This structure can be combined with any one of the above structures.

In the present invention having the first or second structure, a TFT is turned on at a desired timing by using a two-stage-before signal.

In the present invention having the three or four structure, a timing at which a TFT of a compensation circuit is turned on is delayed and thus, a timing at which a leak current flows is delayed by connecting multiple inverters to an input terminal of the compensation circuit, even if a threshold voltage of the TFT of the compensation circuit is equal to or less than a desired value. On the other hand, the threshold voltage of the TFT of the compensation circuit is equal to or more than a desired value, generation of a leak current can be suppressed.

In the present invention having the fifth or sixth structure, a current performance of a clocked inverter is set large to accurately hold a signal. Further, it is possible to supply a signal with a stable waveform, not being blunted, when the signal rises or falls.

Further, in the present invention, it is possible to change a double-gate TFT (two TFTs connected in series) into a single-gate TFT. As a result, in the present invention, it is not required to increase the gate widths of the TFTs and it is possible to reduce the sizes of the TFTs, which makes it possible to realize a high integration. Further, a burden on an element, whose gate (gate capacitance) functions as a load, is reduced and the overall load is also reduced, so that a high frequency operation becomes possible. It is also possible to enhance the current performance of the TFT to be used. An accurate operation is performed with a low voltage, even when a signal with 3 V amplitude is used directly, since the structures according to the present invention are not influenced by fluctuation in a threshold voltage of the TFT.

What is claimed is:

1. A clocked inverter comprising:
   a first transistor and a second transistor electrically connected in series,
   a third transistor and a fourth transistor electrically connected in series and
   a fifth transistor and a sixth transistor electrically connected in series, wherein:
   gates of the third transistor and the fourth transistor are electrically connected to each other,
   drains of the third transistor and the fourth transistor are each electrically connected to a gate of the first transistor,
   sources of the first transistor and the fourth transistor are each electrically connected to a first power source,
   sources of the second transistor and the sixth transistor are each electrically connected to a second power source,
   gates of the fifth transistor and the sixth transistor are electrically connected to each other,
   drains of the fifth transistor and the sixth transistor are each electrically connected to a gate of the second transistor,
   a first signal is inputted to a source of the third transistor,
   a second signal is inputted to a source of the fifth transistor,
   the first signal is different from the second signal,
   an amplitude of the first signal is smaller than a potential difference between the first power source and the second power source, and
   an amplitude of the second signal is smaller than the potential difference between the first power source and the second power source.

2. A clocked inverter according to claim 1, wherein:
   the first power source is a high potential power source;
   the second power source is a low potential power source;
   the first transistor, the fourth transistor, and the fifth transistor are each a P-type transistor; and
   the second transistor, the third transistor, and the sixth transistor are each an N-type transistor.

3. A clocked inverter according to claim 1, wherein:
   the first power source is a low potential power source;
   the second power source is a high potential power source;
   the first transistor, the fourth transistor, and the fifth transistor are each an N-type transistor; and
   the second transistor, the third transistor, and the sixth transistor are each a P-type transistor.

4. A clocked inverter according to claim 1, wherein the third transistor is replaced with an analog switch.

5. A clocked inverter comprising:
   first to third transistors electrically connected in series, and
   a fourth transistor and a fifth transistor electrically connected in series, wherein:
   gates of the fourth transistor and the fifth transistor are electrically connected to each other;
   drains of the fourth transistor and the fifth transistor are each electrically connected to a gate of the first transistor;

sources of the first transistor and the fifth transistor are each electrically connected to a first power source;
a source of the third transistor is electrically connected to a second power source;
a first signal is inputted to a source of the fourth transistor;
a second signal is inputted to a gate of the second transistor,
the first signal is different from the second signal;
an amplitude of the first signal is smaller than a potential difference between the first power source and the second power source;
the first power source is a high potential power source;
the second power source is a low potential power source;
the first transistor and the fifth transistor are each a P-type transistor; and
the second to fourth transistors are each an N-type transistor.

6. A clocked inverter comprising:
first to third transistors electrically connected in series,
a fourth transistor and a fifth transistor electrically connected in series, and
a sixth transistor and a seventh transistor electrically connected in series wherein:
gates of the fourth transistor and the fifth transistor are electrically connected to each other;
drains of the fourth transistor and the fifth transistor are each electrically connected to a gate of the first transistor;
gates of the sixth transistor and the seventh transistor are electrically connected to each other;
drains of the sixth transistor and the seventh transistor are each electrically connected to a gate of the third transistor;
sources of the first transistor and the fifth transistor are each electrically connected to a first power source;
sources of the third transistor and the seventh transistor are each electrically connected to a second power source;
a first signal is inputted to a source of the fourth transistor;
a second signal is inputted to a source of the sixth transistor;
the first signal is different from the second signal;
an amplitude of the first signal is smaller than a potential difference between the first power source and the second power source;
the first power source is a high potential power source;
the second power source is a low potential power source;
the first transistor, the second transistor, the fifth transistor, and the sixth transistor are each a P-type transistor; and
the third transistor, the fourth transistor, and the seventh transistor are each an N-type transistor.

7. A clocked inverter comprising:
first to third transistors electrically connected in series, and
a fourth transistor and a fifth transistor electrically connected in series, wherein:
gates of the fourth transistor and the fifth transistor are electrically connected to each other;
drains of the fourth transistor and the fifth transistor are each electrically connected to a gate of the first transistor;
sources of the first transistor and the fifth transistor are each electrically connected to a first power source;
a source of the third transistor is electrically connected to a second power source;
a first signal is inputted to a source of the fourth transistor;
a second signal is inputted to a gate of the second transistor,
the first signal is different from the second signal;
an amplitude of the first signal is smaller than a potential difference between the first power source and the second power source;
the first power source is a low potential power source;
the second power source is a high potential power source;
the first transistor and the fifth transistor are each an N-type transistor; and
the second to fourth transistors are each a P-type transistor.

8. A clocked inverter comprising:
first to third transistors electrically connected in series
a fourth transistor and a fifth transistor electrically connected in series, and
a sixth transistor and a seventh transistor electrically connected in series, wherein:
gates of the fourth transistor and the fifth transistor are electrically connected to each other;
drains of the fourth transistor and the fifth transistor are each electrically connected to a gate of the first transistor;
gates of the sixth transistor and the seventh transistor are each electrically connected to each other;
drains of the sixth transistor and the seventh transistor are each electrically connected to a gate of the third transistor;
sources of the first transistor and the fifth transistor are each electrically connected to a first power source;
sources of the third transistor and the seventh transistor are each electrically connected to a second power source;
a first signal is inputted to a source of the fourth transistor;
a second signal is inputted to a source of the sixth transistor;
the first signal is different from the second signal;
an amplitude of the first signal is smaller than a potential difference between the first power source and the second power source;
the first power source is a low potential power source;
the second power source is a high potential power source;
the second transistor, the third transistor, the fourth transistor, and the seventh transistor are each an N-type transistor; and
the first transistor, the fifth transistor, and the sixth transistor are each a P-type transistor.

9. A clocked inverter according to claim 5, wherein the fourth transistor is replaced with an analog switch.

10. A NAND comprising:
a first transistor and a second transistor;
a third transistor; and
a fourth transistor and a fifth transistor electrically connected in series, wherein:
a drain of the first transistor is electrically connected to a drain of the second transistor and a drain of the third transistor;
gates of the fourth transistor and the fifth transistor are electrically connected to each other;
drains of the fourth transistor and the fifth transistor are each electrically connected to a gate of the third transistor;
sources of the first transistor and the second transistor are each electrically connected to a first potential power source;

sources of the third transistor and the fifth transistor are each electrically connected to a second potential power source; and an amplitude of a signal inputted to a source of the fourth transistor and each of gates of the first transistor, the second transistor, the fourth transistor, and the fifth transistor is smaller than a potential difference between the first potential power source and the second potential power source.

11. A NAND according to claim 10, wherein:
the first power source is a high potential power source;
the second power source is a low potential power source; and
the first transistor, the second transistor, and the fourth transistor are each a P-type transistor, and the third transistor and the fifth transistor are each an N-type transistor.

12. A NAND according to claim 10, wherein the fourth transistor is replaced with an analog switch.

13. A NOR comprising:
a first transistor and a second transistor;
a third transistor; and
a fourth transistor and a fifth transistor electrically connected in series, wherein:
a drain of the first transistor is electrically connected to a drain of the second transistor and a drain of the third transistor;
gates of the fourth transistor and the fifth transistor are electrically connected to each other;
drains of the fourth transistor and the fifth transistor are each electrically connected to a gate of the third transistor;
sources of the first transistor and the second transistor are each electrically connected to a first potential power source;
sources of the third transistor and the fifth transistor are each electrically connected to a second potential power source; and
an amplitude of a signal inputted to each of gates of the first transistor, the second transistor, the fourth transistor, and the fifth transistor and to a source of the fourth transistor is smaller than a potential difference between the first potential power source and the second potential power source.

14. A NOR according to claim 13, wherein:
the first power source is a low potential power source;
the second power source is a high potential power source; and
the first transistor, the second transistor, and the fourth transistor are each an N-type transistor, and the third transistor and the fifth transistor are each a P-type transistor.

15. A NOR according to claim 13, wherein: the fourth transistor is replaced with an analog switch.

16. A shift register comprising:
a clocked inverter including a first transistor to a third transistor electrically connected in series; and
a fourth transistor and a fifth transistor electrically connected in series, wherein:
sources of the first transistor and the fifth transistor are each electrically connected to a first power source;
a source of the third transistor is electrically connected to a second power source;
a gate of the first transistor is electrically connected to drains of the fourth transistor and the fifth transistor;

a pulse generated at an (n-1)th stage is inputted to gates of the fourth transistor and the fifth transistor arranged at an n-th stage; and
a pulse or a clock signal generated at an (n-2)th stage is inputted to a source of the fourth transistor arranged at the n-th stage.

17. A shift register according to claim 16, wherein:
the first power source is a low potential power source;
the second power source is a high potential power source;
the first transistor and the fifth transistor are each an N-type transistor; and
the second to fourth transistors are each a P-type transistor.

18. A shift register according to claim 16, wherein:
the first power source is a high potential power source;
the second power source is a low potential power source;
the first transistor and the fifth transistor are each a P-type transistor; and
the second to fourth transistors are each an N-type transistor.

19. A shift register according to claim 16, wherein the fourth transistor is replaced with an analog switch.

20. A shift register according to claim 16, wherein the second transistor is eliminated.

21. A shift register comprising:
a plurality of stages each of which includes: a clocked inverter including a first transistor and a second transistor electrically connected in series; an inverter; and a third transistor and an analog switch, wherein:
the first transistor is a P-type transistor,
the second transistor and the third transistor are each an N-type transistor;
a gate of the first transistor is electrically connected to an output terminal of the inverter and a source of the first transistor is electrically connected to a high potential power source;
a gate of the second transistor is electrically connected to a clock signal line through the analog switch and a source of the second transistor is electrically connected to a low potential power source; and
the analog switch is electrically connected to the output terminal of the inverter and an input terminal of the inverter.

22. A shift register comprising:
a plurality of stages each of which includes: a clocked inverter including a first transistor and a second transistor electrically connected in series; an inverter; and a third transistor and an analog switch, wherein:
the first transistor is an N-type transistor;
the second transistor and the third transistor are each a P-type transistor;
a gate of the first transistor is electrically connected to an output terminal of the inverter and a source of the first transistor is electrically connected to a low potential power source;
a gate of the second transistor is electrically connected to a clock signal line through the analog switch and a source of the second transistor is electrically connected to a high potential power source; and
the analog switch is electrically connected to the output terminal of the inverter and an input terminal of the inverter.

23. A clocked inverter comprising:
a first transistor and a second transistor electrically connected in series,
a third transistor and a fourth transistor electrically connected in series, and a fifth transistor and a sixth transistor electrically connected in series, wherein:

gates of the third transistor and the fourth transistor are electrically connected to each other, drains of the third transistor and the fourth transistor are each electrically connected to a gate of the first transistor, sources of the first transistor and the fourth transistor are each electrically connected to a first power source, sources of the second transistor and the sixth transistor are each electrically connected to a second power source, gates of the fifth transistor and the sixth transistor are electrically connected to each other, drains of the fifth transistor and the sixth transistor are each electrically connected to a gate of the second transistor, a first signal is inputted to a source of the third transistor, and a second signal is inputted to a source of the fifth transistor.

24. A shift register comprising:

a first circuit inputted with a first signal;

a second circuit inputted with a second signal;

a first clocked inverter electrically connected with the first and second circuits;

a third circuit comprising a first analog switch, inputted with the first signal;

a fourth circuit comprising a second analog switch, inputted with the second signal; and a second clocked inverter electrically connected with the third and fourth circuits.

25. A clocked inverter according to claim 1, wherein the fifth transistor is replaced with an analog switch.

26. A shift register according to claim 16, wherein:

the first power source is a low potential power source;

the second power source is a high potential power source;

the first transistor, the second transistor, and the fifth transistor are each an N-type transistor; and the third transistor and the fourth transistor are each a P-type transistor.

27. A shift register according to claim 16, wherein:

the first power source is a high potential power source;

the second power source is a low potential power source;

the first transistor, the second transistor, and the fifth transistor are each a P-type transistor; and the third transistor and the fourth transistor are each an N-type transistor.

28. A shift register according to claim 21, wherein:

a gate of the third transistor is electrically connected to the input terminal of the inverter, a source of the third transistor is electrically connected to the low potential power source, and a drain of the third transistor is electrically connected to the gate of the second transistor.

29. A shift register according to claim 22, wherein:

a gate of the third transistor is electrically connected to the input terminal of the inverter, a source of the third transistor is electrically connected to the high potential power source, and a drain of the third transistor is electrically connected to the gate of the second transistor.

30. A shift register according to claim 24, wherein:

the first clocked inverter comprises a first transistor and a second transistor in series, the first circuit comprises a third transistor and a fourth transistor in series, the second circuit comprises a fifth transistor and a sixth transistor in series, and the second clocked inverter comprises a seventh transistor and an eighth transistor in series.

31. A shift register according to claim 24, further comprising an inverter.

32. A clocked inverter according to claim 6, wherein the fourth transistor is replaced with an analog switch.

33. A clocked inverter according to claim 7, wherein the fourth transistor is replaced with an analog switch.

34. A clocked inverter according to claim 8, wherein the fourth transistor is replaced with an analog switch.

* * * * *